United States Patent
Nishisaka et al.

(10) Patent No.: US 9,429,847 B2
(45) Date of Patent: Aug. 30, 2016

(54) EXTREME ULTRAVIOLET LIGHT SOURCE APPARATUS

(71) Applicant: Gigaphoton Inc., Tochigi-ken (JP)

(72) Inventors: Toshihiro Nishisaka, Hiratsuka (JP); Yukio Watanabe, Hiratsuka (JP); Osamu Wakabayashi, Hiratsuka (JP); Kouji Kakizaki, Hiratsuka (JP); Michio Shinozaki, Hiratsuka (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 15/064,019

(22) Filed: Mar. 8, 2016

(65) Prior Publication Data

US 2016/0187787 A1    Jun. 30, 2016

Related U.S. Application Data

(63) Continuation of application No. 14/707,990, filed on May 8, 2015, now Pat. No. 9,332,625, which is a continuation of application No. 12/543,582, filed on Aug. 19, 2009, now Pat. No. 9,052,615.

(30) Foreign Application Priority Data

Aug. 29, 2008 (JP) .................................. 2008-220892

(51) Int. Cl.
*H05G 2/00* (2006.01)
*G03F 7/20* (2006.01)

(52) U.S. Cl.
CPC ............ *G03F 7/70033* (2013.01); *H05G 2/00* (2013.01)

(58) Field of Classification Search
USPC .................................................... 250/504 R
See application file for complete search history.

(56) References Cited

U.S. PATENT DOCUMENTS 3,602,147 A    8/1971    Hart
4,236,861 A    12/1980   Grove
(Continued)

FOREIGN PATENT DOCUMENTS

JP    4-226463 A    8/1992
JP    2001-319873 A    11/2001
(Continued)

OTHER PUBLICATIONS

Japanese Notice of Reasons for Rejection issued in Japanese Application No. 2009-193886 dated Feb. 18, 2014, with English translation.

(Continued)

*Primary Examiner* — Kiet T Nguyen
(74) *Attorney, Agent, or Firm* — Studebaker & Brackett PC

(57) ABSTRACT

An EUV light source apparatus by which detachment of a chamber or a part of the chamber, movement to a maintenance area, and highly accurate placement relative to projection optics can be performed easily for maintenance of the EUV light source apparatus. The EUV light source apparatus is an apparatus for generating plasma by applying a laser beam to a target material within a chamber and entering EUV light radiated from the plasma into projection optics of exposure equipment, and includes a positioning mechanism for positioning the chamber or a maintenance unit of the chamber in a predetermined location where an optical axis of the collected extreme ultraviolet light and an optical axis of the projection optics of the exposure equipment are aligned, and a movement mechanism for moving the chamber or the maintenance unit of the chamber between the predetermined location and a maintenance area.

8 Claims, 30 Drawing Sheets

(56) References Cited

U.S. PATENT DOCUMENTS

| | | |
|---|---|---|
| 4,346,887 A | 8/1982 | Poole |
| 4,352,622 A | 10/1982 | Wieschel |
| 4,572,956 A | 2/1986 | Tojo et al. |
| 5,204,711 A | 4/1993 | Takubo et al. |
| 6,529,260 B2 | 3/2003 | Sogard |
| 6,972,421 B2 | 12/2005 | Melnychuk et al. |
| 7,091,507 B2 | 8/2006 | Masaki et al. |
| 7,265,366 B2 | 9/2007 | Van Der Pasch et al. |
| 7,297,968 B2 | 11/2007 | Endo et al. |
| 7,491,954 B2 | 2/2009 | Bykanov et al. |
| 7,525,111 B2 | 4/2009 | Bowering |
| 8,891,161 B2 | 11/2014 | Mizoguchi et al. |
| 9,052,615 B2 | 6/2015 | Nishisaka et al. |
| 2004/0135985 A1 | 7/2004 | Bakker et al. |
| 2004/0179192 A1 | 9/2004 | Mizuno et al. |
| 2004/0259364 A1 | 12/2004 | Tanaka et al. |
| 2006/0002113 A1* | 1/2006 | Chandhok ............. B82Y 10/00 362/257 |
| 2006/0006350 A1 | 1/2006 | Schuurmans et al. |
| 2006/0119828 A1 | 6/2006 | Ito et al. |
| 2006/0146413 A1 | 7/2006 | Klunder et al. |
| 2006/0176460 A1 | 8/2006 | Phillips et al. |
| 2006/0186356 A1 | 8/2006 | Imai et al. |
| 2006/0215136 A1 | 9/2006 | Fujimoto |
| 2006/0249698 A1 | 11/2006 | Endo et al. |
| 2007/0158600 A1 | 7/2007 | Sakai et al. |
| 2008/0017801 A1 | 1/2008 | Fomenkov et al. |
| 2008/0053946 A1 | 3/2008 | Choate et al. |
| 2008/0087847 A1 | 4/2008 | Bykanov et al. |
| 2008/0104828 A1 | 5/2008 | Someya et al. |
| 2008/0128215 A1 | 6/2008 | Nowitz |
| 2008/0304773 A1 | 12/2008 | Chen et al. |
| 2009/0261277 A1 | 10/2009 | Soumagne |
| 2010/0051832 A1 | 3/2010 | Nishisaka et al. |
| 2010/0193711 A1 | 8/2010 | Watanabe et al. |
| 2010/0288937 A1 | 11/2010 | Watanabe et al. |
| 2011/0163247 A1 | 7/2011 | Soumagne et al. |
| 2013/0221247 A1 | 8/2013 | Someya et al. |

FOREIGN PATENT DOCUMENTS

| | | |
|---|---|---|
| JP | 2006-108686 A | 4/2006 |
| JP | 2008-108599 A | 5/2008 |
| JP | 2008-118020 A | 5/2008 |

OTHER PUBLICATIONS

Japanese Office Action issued in Japanese Patent Application No. 2009-193886 dated Jul. 2, 2013 with English translation.
Office Action U.S. Appl. No. 12/685,835 dated Dec. 21, 2012.
Office Action U.S. Appl. No. 12/685,835 dated Jul. 12, 2011.
Office Action U.S. Appl. No. 12/685,835 dated Mar. 9, 2012.
Non-Final Office Action U.S. Appl. No. 12/543,582 dated Apr. 26, 2011.
Final Office Action U.S. Appl. No. 12/543,582 dated Dec. 5, 2011.
Non-Final Office Action U.S. Appl. No. 12/543,582 dated Dec. 21, 2012.
Final Office Action U.S. Appl. No. 12/543,582 dated Jul. 5, 2013.
Non-Final Office Action U.S. Appl. No. 12/543,582 dated Nov. 4, 2013.
Final Office Action U.S. Appl. No. 12/543,582 dated May 28, 2014.
Notice of Allowance U.S. Appl. No. 12/543,582 dated Feb. 9, 2015.

* cited by examiner

*FIG.9A*
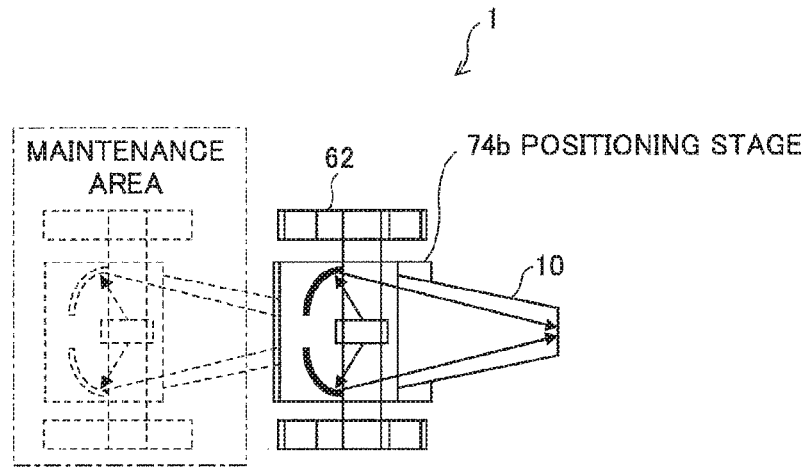
*FIG.9B*  *FIG.9C*
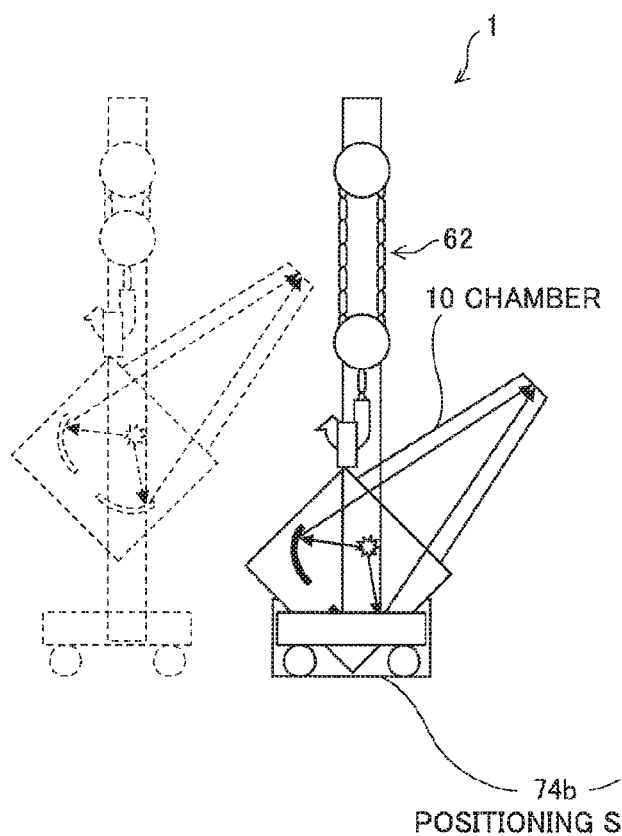
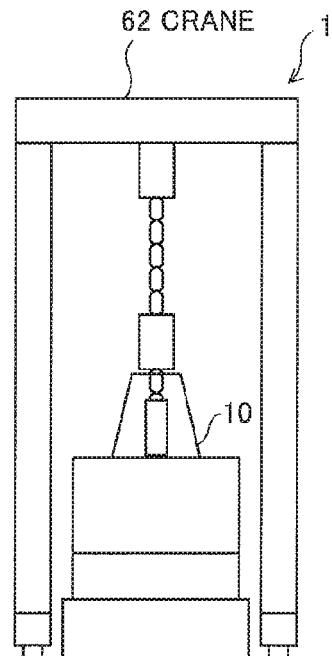

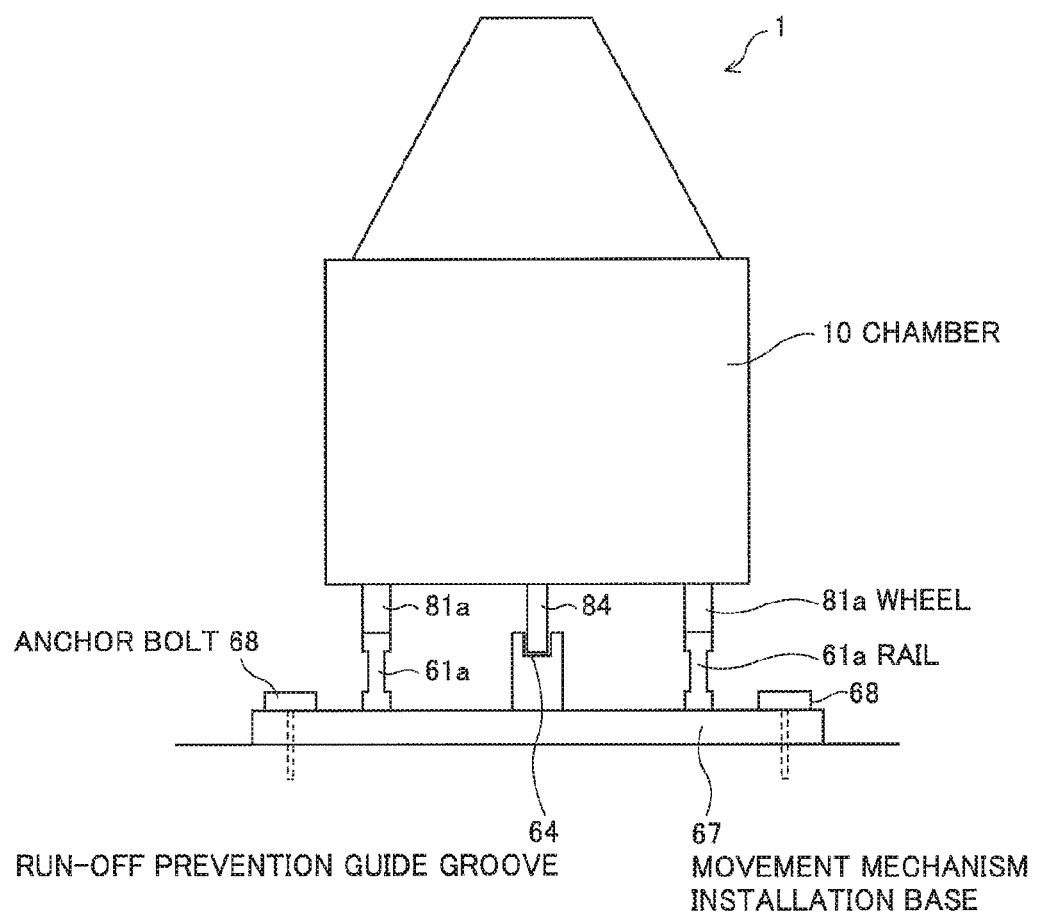

FIG.33A

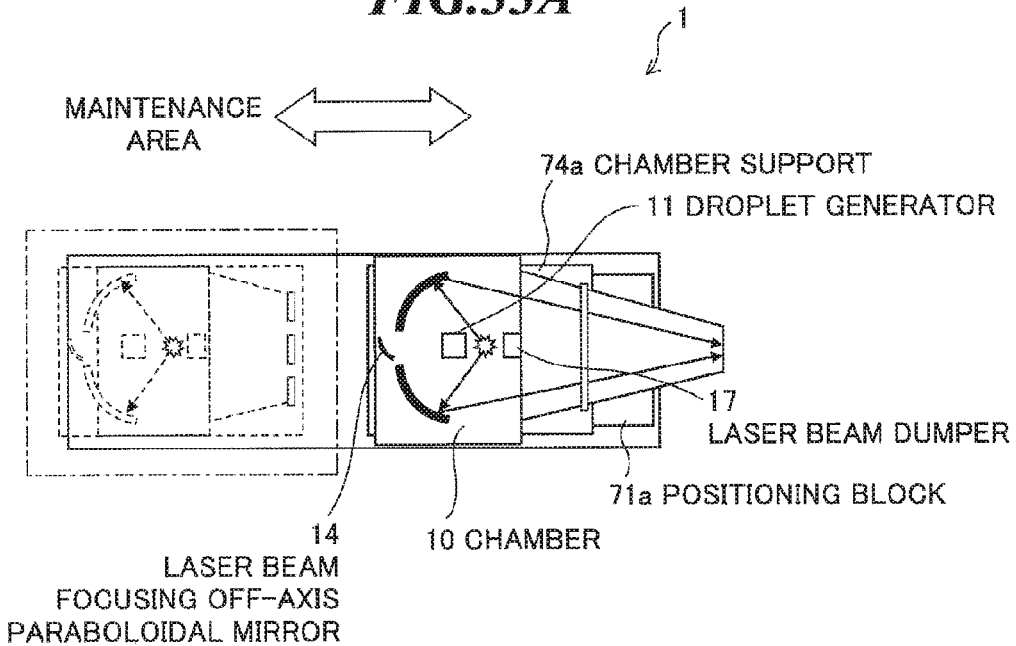

MAINTENANCE AREA

74a CHAMBER SUPPORT
11 DROPLET GENERATOR
17
LASER BEAM DUMPER
71a POSITIONING BLOCK
14 LASER BEAM FOCUSING OFF-AXIS PARABOLOIDAL MIRROR
10 CHAMBER

FIG.33B

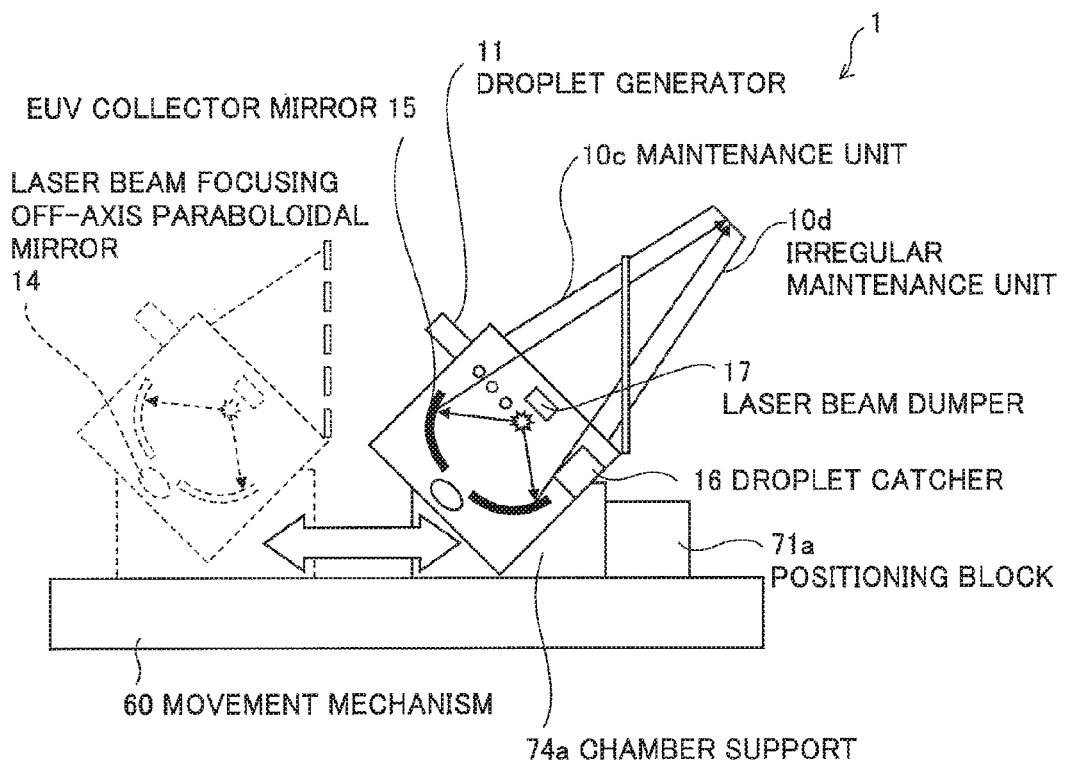

11 DROPLET GENERATOR
EUV COLLECTOR MIRROR 15
10c MAINTENANCE UNIT
LASER BEAM FOCUSING OFF-AXIS PARABOLOIDAL MIRROR 14
10d IRREGULAR MAINTENANCE UNIT
17 LASER BEAM DUMPER
16 DROPLET CATCHER
71a POSITIONING BLOCK
60 MOVEMENT MECHANISM
74a CHAMBER SUPPORT

EXTREME ULTRAVIOLET LIGHT SOURCE APPARATUS

CROSS-REFERENCE TO RELATED APPLICATION

This application is a Continuation of U.S. Ser. No. 14/707,990, filed May 8, 2015, which is a Continuation of U.S. Ser. No. 12/543,582, filed Aug. 19, 2009, claims priority from Japanese Patent Application No. 2008-220892, filed Aug. 29, 2008, the entire contents of which are incorporated herein by reference.

BACKGROUND OF THE INVENTION

1. Field of the Invention

The present invention relates to an extreme ultraviolet (EUV) light source apparatus to be used as a light source of exposure equipment.

2. Description of a Related Art

In recent years, as semiconductor processes become finer, photolithography has been making rapid progress toward finer fabrication. In the next generation, microfabrication at 70 nm to 45 nm, further, microfabrication at 32 nm and beyond will be required. Accordingly, in order to fulfill the requirement for microfabrication at 32 mm and beyond, for example, exposure equipment is expected to be developed by combining an EUV light source for generating EUV light having a wavelength of about 13 nm and reduced projection reflective optics.

As the EUV light source, there are three kinds of light sources, which include an LPP (laser produced plasma) light source using plasma generated by applying a laser beam to a target (hereinafter, also referred to as "LPP type EUV light source apparatus"), a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be considerably made larger, that the light emission of only the necessary waveband can be performed by selecting the target material, and that an extremely large collection solid angle of 2π steradian can be ensured because it is a point light source having substantially isotropic angle distribution and there is no structure such as electrodes surrounding the light source. Therefore, the LPP light source is considered to be predominant as a light source for EUV lithography, which requires power of more than several tens of watts.

In the LPP type EUV light source apparatus, EUV light is generated on the following principle. That is, by supplying a target material into a vacuum chamber by using a nozzle and applying a laser beam to the target material, the target material is excited and turned into plasma. Various wavelength components including extreme ultraviolet (EUV) light are radiated from the plasma generated in this manner. Then, a desired wavelength component (e.g., 13.5 nm) among them is selectively reflected and collected by using a collector mirror, and outputted to an exposure unit (projection optics). For example, as a collector mirror for collecting EUV light having a wavelength near 13.5 nm, a mirror having a reflecting surface on which molybdenum (Mo) and silicon (Si) thin films are alternately stacked is used. Typically, the number of stacked Mo/Si thin films is from sixty to several hundreds.

As a related technology, Japanese Patent Application Publication JP-P2006-108686A discloses a lithography apparatus for applying EUV light to a virtual light source point of projection optics in alignment with an optical axis of the projection optics by providing an oblique incidence mirror within an EUV light source apparatus (radiation unit).

However, in JP-P2006-108686A, loss in EUV light intensity is caused by providing the oblique incidence mirror. Generally, the reflectance of EUV light by a mirror is about 60%, and therefore, the use efficiency of EUV light becomes lower by about 60% at each time one mirror is added.

Further, U.S. Patent Application Publication US 2006/0146413 A1 discloses a lithographic apparatus for applying EUV light to a virtual light source point of projection optics in alignment with an optical axis of the projection optics by placing an EUV light source apparatus obliquely relative to the direction of gravitational force. According to US 2006/0146413 A1, the number of reflection mirrors is reduced by one than that in JP-P2006-108686A, and therefore, the use efficiency of EUV light can be improved.

However, when the EUV light source apparatus is obliquely placed as in US 2006/0146413 A1, detachment of a chamber or a part of the chamber, movement to a maintenance area, and highly accurate placement relative to the projection optics become difficult in the case of maintenance of the EUV light source apparatus.

SUMMARY OF THE INVENTION

The present invention has been achieved in view of the above-mentioned problems. A purpose of the present invention is to provide an extreme ultraviolet light source apparatus by which detachment of a chamber or a part of the chamber, movement to a maintenance area, and highly accurate placement relative to projection optics can be performed easily for maintenance of the EUV light source apparatus.

In order to accomplish the above-mentioned purpose, an extreme ultraviolet light source apparatus according to one aspect of the present invention is an apparatus for generating plasma by applying a laser beam to a target material and entering extreme ultraviolet light radiated from the plasma into projection optics of exposure equipment, and the apparatus includes: a chamber in which the extreme ultraviolet light is generated; a target supply unit for supplying the target material into the chamber; a driver laser for applying the laser beam to the target material supplied by the target supply unit to generate the plasma; a collector mirror for collecting the extreme ultraviolet light radiated from the plasma; a positioning mechanism for positioning at least a part of the chamber in a predetermined location where an optical axis of the collected extreme ultraviolet light and an optical axis of the projection optics of the exposure equipment are aligned with each other; and a movement mechanism for moving at least the part of the chamber positioned in the predetermined location between the predetermined location and a maintenance area.

According to the present invention, since the positioning mechanism for positioning the chamber or a part of the chamber requiring maintenance in the predetermined location and the movement mechanism for moving the chamber or the part of the chamber between the predetermined location and the maintenance area are provided, detachment of the chamber or the part of the chamber, movement to the maintenance area, and highly accurate placement relative to the projection optics can be performed easily for maintenance of the EUV light source apparatus.

BRIEF DESCRIPTION OF THE DRAWINGS

FIGS. 9A-9C are a plan view, a side view, and a rear view showing a seventh example related to the movement mechanism and the positioning mechanism of the EUV light source apparatus;

FIG. 17 is a rear view showing a fifteenth example related to the movement mechanism and the positioning mechanism of the EUV light source apparatus;

FIGS. 33A and 33B are a plan view and a side view showing a thirty-first example related to the configuration in which only a part of the chamber of the EUV light source apparatus is moved.

DESCRIPTION OF THE PREFERRED EMBODIMENTS

Figure 1A:
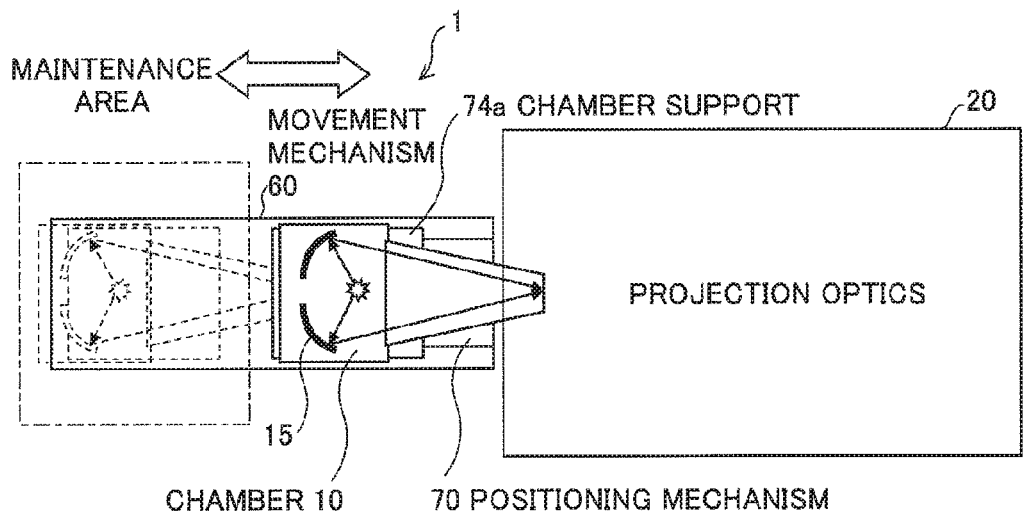
FIGS. 1A and 1B are a plan view and a side view showing an overall configuration of exposure equipment including an extreme ultraviolet (EUV) light source apparatus according to one embodiment of the invention.

Hereinafter, preferred embodiments of the present invention will be explained in detail by referring to the drawings. The same reference numerals are assigned to the same component elements and the description thereof will be omitted.

Figure 1B:
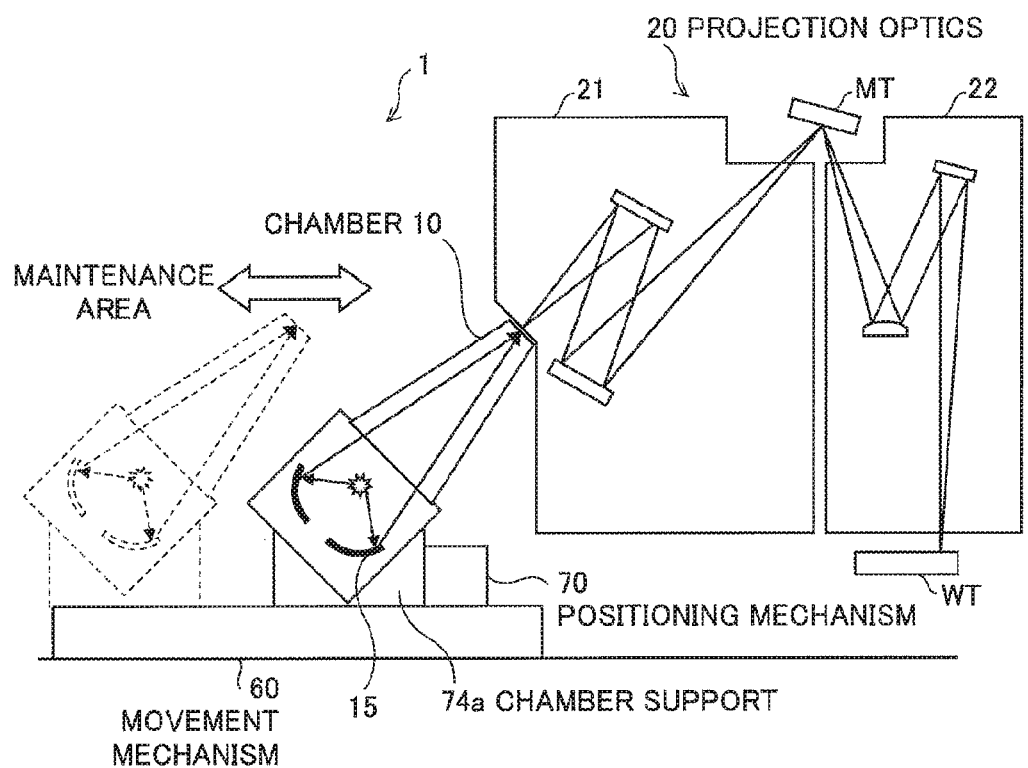

FIGS. 1A and 1B are a plan view and a side view showing an overall configuration of exposure equipment including an extreme ultraviolet (EUV) light source apparatus according to one embodiment of the invention. The exposure equipment includes an EUV light source apparatus 1 and projection optics 20.

The EUV light source apparatus 1 employs a laser produced plasma (LPP) system for generating EUV light by applying a laser beam to a target material for excitation. As shown in FIGS. 1A and 1B, the EUV light source apparatus 1 has a chamber 10 in which EUV light is generated, a movement mechanism 60, and a positioning mechanism 70. The chamber 10 is a vacuum chamber in which extreme ultraviolet light is generated.

Figure 2:
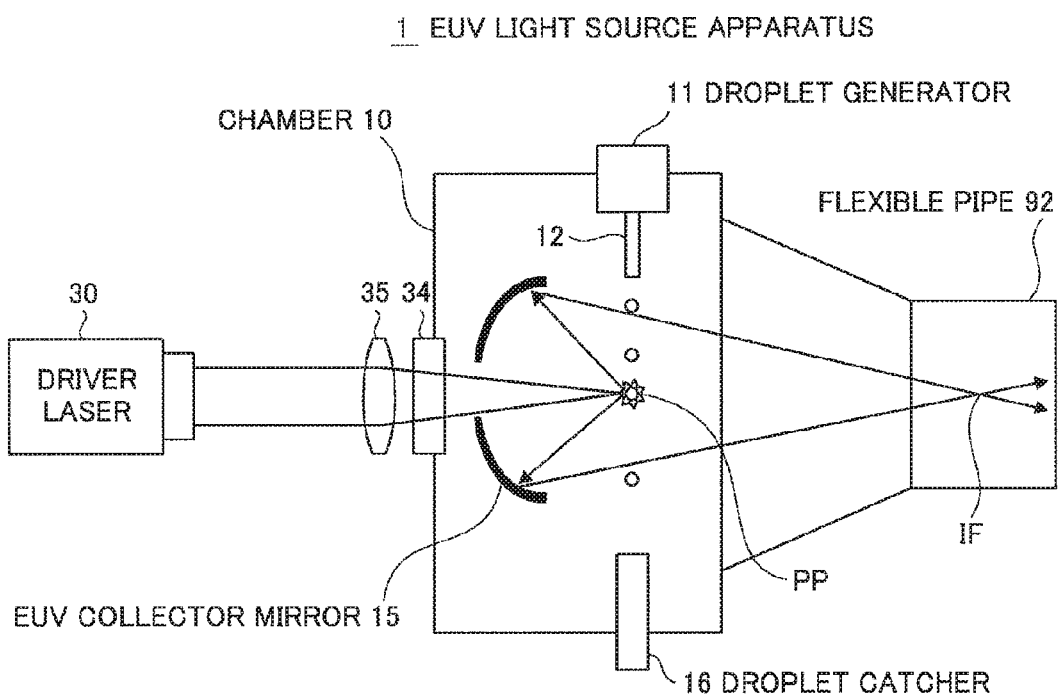
FIG. 2 is a schematic diagram showing an outline of a chamber and peripheral devices forming the EUV light source apparatus.

FIG. 2 is a schematic diagram showing an outline of the chamber and peripheral devices forming the EUV light source apparatus. The EUV light source apparatus 1 has a droplet generator 11, a droplet catcher 16, a driver laser 30, and a flexible pipe 92 as shown in FIG. 2 in addition to the chamber 10, the movement mechanism 60, and the positioning mechanism 70 as shown in FIGS. 1A and 1B.

The droplet generator 11 is a unit for supplying a target material of tin (Sn), lithium (Li), or the like to be used for generating EUV light into the chamber 10 via a target nozzle 12. Here, the droplet generator 11 corresponds to a target supply unit for supplying the target material into the chamber. Among the supplied target material, the unnecessary material, to which the laser beam has not been applied, is collected by the droplet catcher 16.

The state of the target material may be solid, liquid, or gas, and the target material may be supplied to a space within the chamber 10 in any known form such as continuous flow (target jet) or droplets. For example, when a melted metal of tin (Sn) is used as the target material, the droplet generator 11 includes a heater for melting Sn, a compressed gas cylinder for supplying a high-purity Ar gas for injecting the melted metal Sn, a mass flow controller, a target nozzle, and so on. Further, in the case where droplets are generated, a vibrating unit such as a piezoelectric element is added to the target nozzle.

The driver laser 30 is a master oscillator power amplifier type laser apparatus for generating a driving laser beam to be used for excitation of the target material. The laser beam generated by the driver laser 30 is focused via a laser beam focusing optics 35 including at least one lens and/or at least one mirror and a laser beam introduction chamber window 34 for passing the laser beam into the chamber 10, so as to form a focal point on the trajectory of the target material within the chamber 10. When the laser beam is applied to the target material, plasma is generated, and light having various wavelengths is radiated from it.

Within the chamber 10, an EUV collector mirror 15 is provided. The reflection surface of the EUV collector mirror 15 is coated with a multilayer film that reflects EUV light having a specific wavelength component (e.g., 13.5 nm) among the light having various wavelengths radiated from the plasma, at high reflectance. The reflection surface of the EUV collector mirror 15 has an ellipsoidal shape. The EUV collector mirror 15 is provided such that the first focal point of the ellipse is located at a plasma emission point (PP), and the EUV light is focused on the second focal point of the ellipse as an intermediate focus point (IF).

The flexible pipe 92 for allowing the EUV light emitted from the EUV collector mirror 15 to enter the projection optics 20 is connected between the chamber 10 and the projection optics 20. The flexible pipe 92 will be described later in the explanation of FIG. 31.

Referring to FIGS. 1A and 1B again, the projection optics 20 has a mask radiation unit 21 for illumination of a mask, and a workpiece radiation unit 22 for projection exposure of the mask image on a workpiece such as a wafer. The mask radiation unit 21 applies the EUV light entering from the EUV light source apparatus 1 onto a mask pattern of a mask table MT via reflection optics. The workpiece radiation unit 22 focuses the EUV light reflected from the mask table MT on the workpiece (semiconductor wafer or the like) disposed on a workpiece table WT via reflection optics. Then, the mask table MT and the workpiece table WT are moved in parallel at the same time, and the mask pattern is transcribed to the workpiece.

The positioning mechanism 70 includes a chamber support 74a conformed to the shape of the chamber 10. The chamber support 74a holds the chamber 10 in a position oblique relative to the direction of gravitational force such that the optical axis of the EUV light emitted from the EUV collector mirror 15 is aligned with the optical axis of the projection optics 20. Since the chamber support 74a is conformed to the chamber 10, the chamber 10 is fit in the chamber support 74a, and thereby, the chamber 10 can be properly held in the posture in which the optical axis of the EUV light emitted from the EUV collector mirror 15 is aligned with the optical axis of the projection optics 20.

The positioning mechanism 70 positions the chamber support 74a such that the chamber 10 is positioned in a predetermined location where the optical axis of the EUV light emitted from the EUV collector mirror 15 is aligned with the optical axis of the projection optics 20. The details of the configuration of positioning the chamber support 74a will be described later, and various configurations such as stoppers, positioning pins, or six-axis stage may be used. In FIGS. 1A and 1B, the state in which the chamber 10 is positioned in the predetermined location in alignment with the optical axis of the projection optics 20 together with the chamber support 74a is shown by solid lines.

The movement mechanism 60 is a mechanism of moving the chamber 10 between the predetermined location where the chamber 10 is positioned by the positioning mechanism 70 and a maintenance area in which maintenance can be done. The details of the movement mechanism 60 will be described later, and various configurations such as rails and wheels, a crane, and an air generator may be used. In FIGS. 1A and 1B, the state in which the chamber 10 is moved to the maintenance area together with the chamber support 74a is shown by broken lines.

In the configuration as described above, according to the embodiment, the EUV light source apparatus 1 can be placed in an oblique condition with high accuracy such that the optical axis of the EUV light emitted from the EUV collector mirror 15 is aligned with the optical axis of the projection optics 20 of the exposure equipment. On the other hand, at maintenance of the chamber 10 of the EUV light source apparatus 1, the chamber 10 can be detached from the projection optics 20 in safety. Further, after maintenance of the chamber 10, the chamber 10 can be placed with high accuracy relative to the projection optics 20. Furthermore, detachment and placement for maintenance of the chamber 10 can be performed in a short time.

Next, a specific configuration example of the EUV light source apparatus of the above-mentioned embodiment will be explained.

Figure 3A:
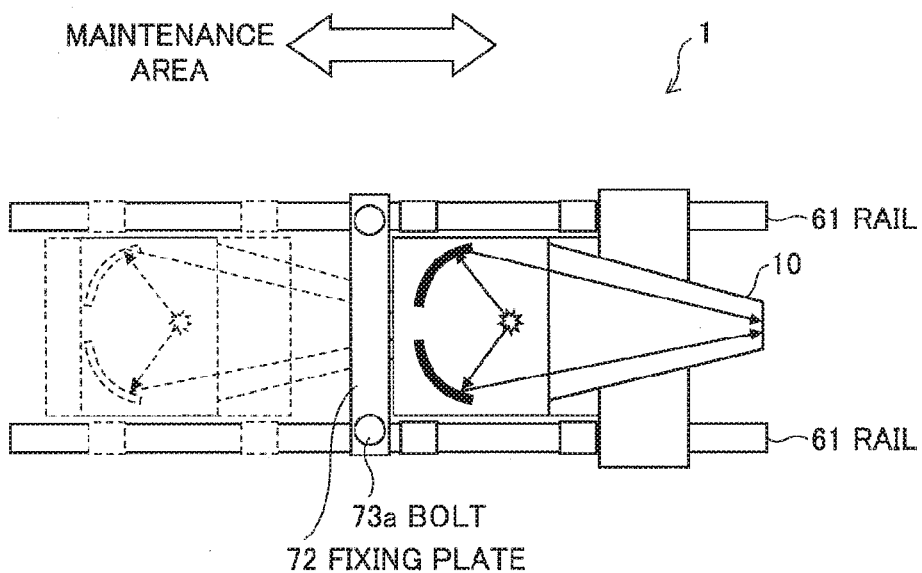
FIGS. 3A and 3B are a plan view and a side view showing a first example related to a movement mechanism and a positioning mechanism of the EUV light source apparatus.
Figure 3B:
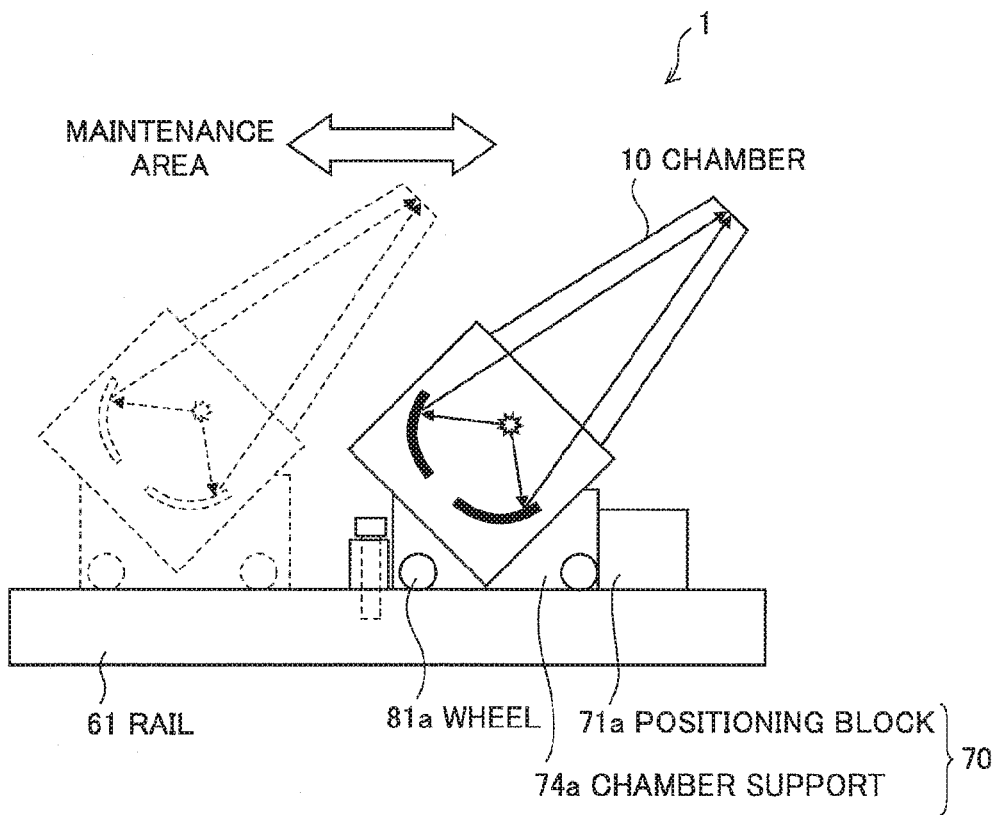

FIGS. 3A and 3B are a plan view and a side view showing a first example related to the movement mechanism and the positioning mechanism of the EUV light source apparatus.

As shown in FIGS. 3A and 3B, the EUV light source apparatus 1 according to the first example includes, as the movement mechanism 60, two parallel rails 61 placed on the floor. Wheels 81a are attached to the chamber support 74a. As the wheels 81a roll along the rails 61, the chamber support 74a moves together with the chamber 10. In addition, sliding bearings may be used in place of the wheels 81a. Further, also in the following explanation, sliding bearings may be used in place of the wheels 81a.

Furthermore, the EUV light source apparatus 1 according to the first example includes, as the positioning mechanism 70, a positioning block 71a placed in a location at the same side as the projection optics 20, and a fixing plate 72 placed in a location at the opposite side to the projection optics 20.

Members for fixing the chamber support 74a in contact therewith are provided on the fixing plate 72.

The positioning block 71a is constantly placed on the rails 61, and regulates the movement of the chamber support 74a toward the projection optics 20. The fixing plate 72 is placed on the rails 61 under the condition that the chamber support 74a is pressed against the positioning block 71a, and secured by bolts 73a or pins to regulate the movement of the chamber support 74a toward the opposite side to the projection optics 20.

By the positioning block 71a and the fixing plate 72, the movement of the chamber support 74a and the chamber 10 along the traveling direction on the rails 61 is regulated, and the chamber 10 is positioned in the predetermined location in alignment with the optical axis of the projection optics 20. At maintenance of the chamber 10, the bolts 73a and the fixing plate 72 are detached and the chamber support 74a is moved to the location as shown by the broken lines in FIGS. 3A and 3B.

In the embodiment, the rails 61 are provided on the floor and the wheels 81a are provided to the chamber support 74a. However, the invention is not limited to that, and the wheels may be provided to the floor and the rails may be provided on the chamber support 74a. In this case, for example, four wheels are placed on the floor and rails are placed under the chamber support 74a, and thereby, movement and positioning can be easily performed.

Figure 4A:
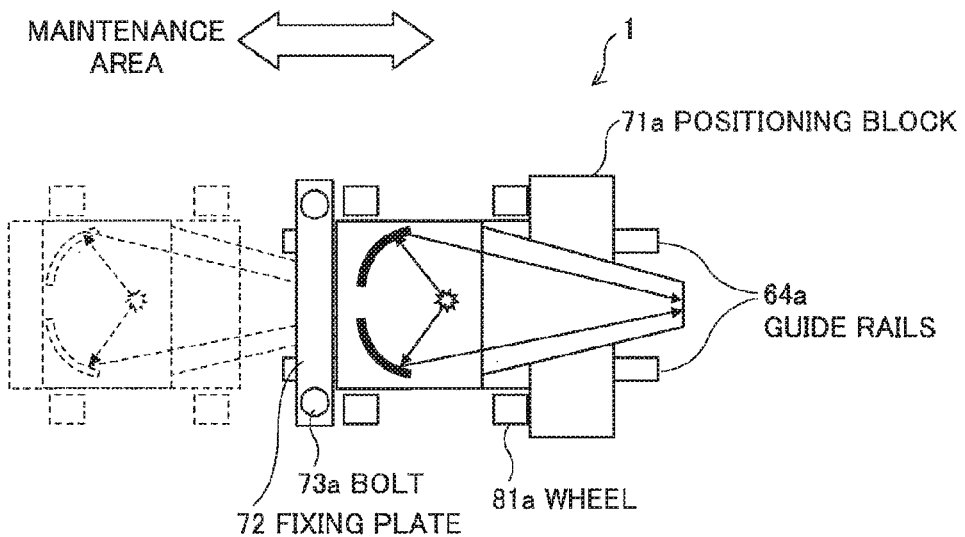
FIGS. 4A and 4B are a plan view and a side view showing a second example related to the movement mechanism and the positioning mechanism of the EUV light source apparatus.
Figure 4B:
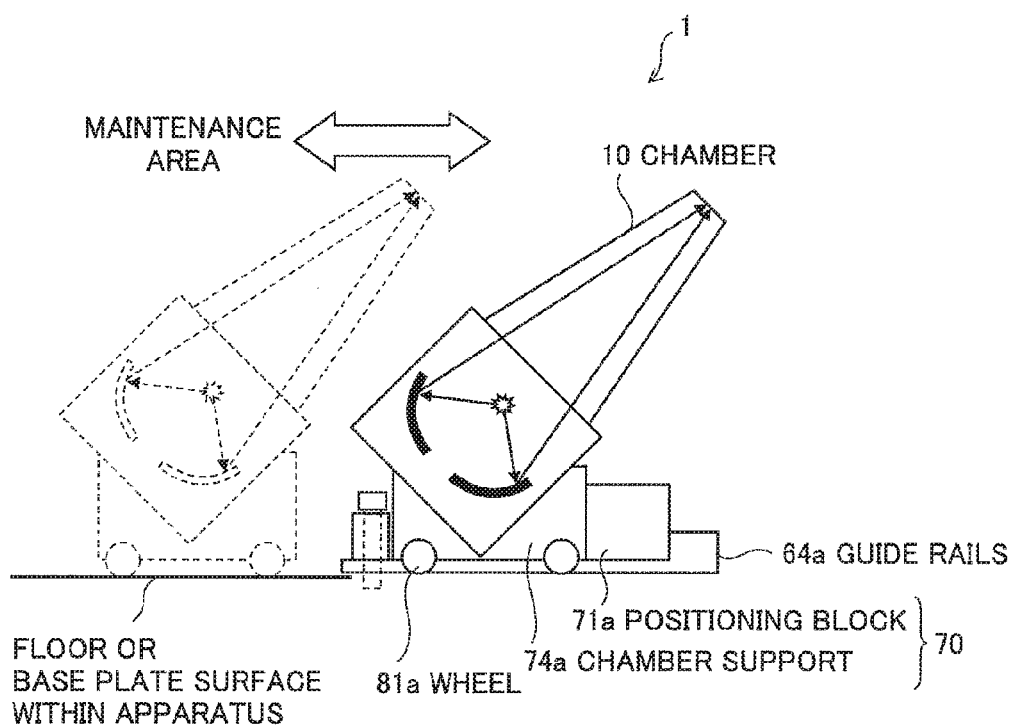

FIGS. 4A and 4B are a plan view and a side view showing a second example related to the movement mechanism and the positioning mechanism of the EUV light source apparatus.

As shown in FIGS. 4A and 4B, in the EUV light source apparatus 1 according to the second example, as the movement mechanism, wheels 81a are provided to the chamber support 74a and guide rails 64a are provided on a floor (or a base plate surface within an apparatus), respectively. The chamber support 74a on which the chamber 10 is mounted moves as the wheels 81a roll on the floor. In the first example as shown in FIGS. 3A and 3B, the rails 61 on the floor are provided from the positioning block 71a through the fixing location of the fixing plate 72 to the maintenance area. On the other hand, in the second example, the guide rails 64a are provided only from the location of the positioning block 71a to the fixing location of the fixing plate 72, and the guide rails 64a are not provided to the maintenance area.

Therefore, in the second example, the chamber support 74a, on which the chamber 10 is mounted, can travel without regulation of the guide rails 64a in the maintenance area, while its traveling path is regulated by the guide rails 64a between the location of the positioning block 71a and the fixing location of the fixing plate 72. The chamber 10 in the longitudinal direction of the guide rails 64a is positioned by the positioning block 71a in contact with the front end of the chamber support 74a and the fixing plate 72 in contact with the rear end of the chamber support 74a, in the same way as in the first example. Alternatively, instead of the positioning block 71a, the same positioning member as the fixing plate 72 may be fixed in the location in contact with the front end of the chamber support 74a.

Figure 18:
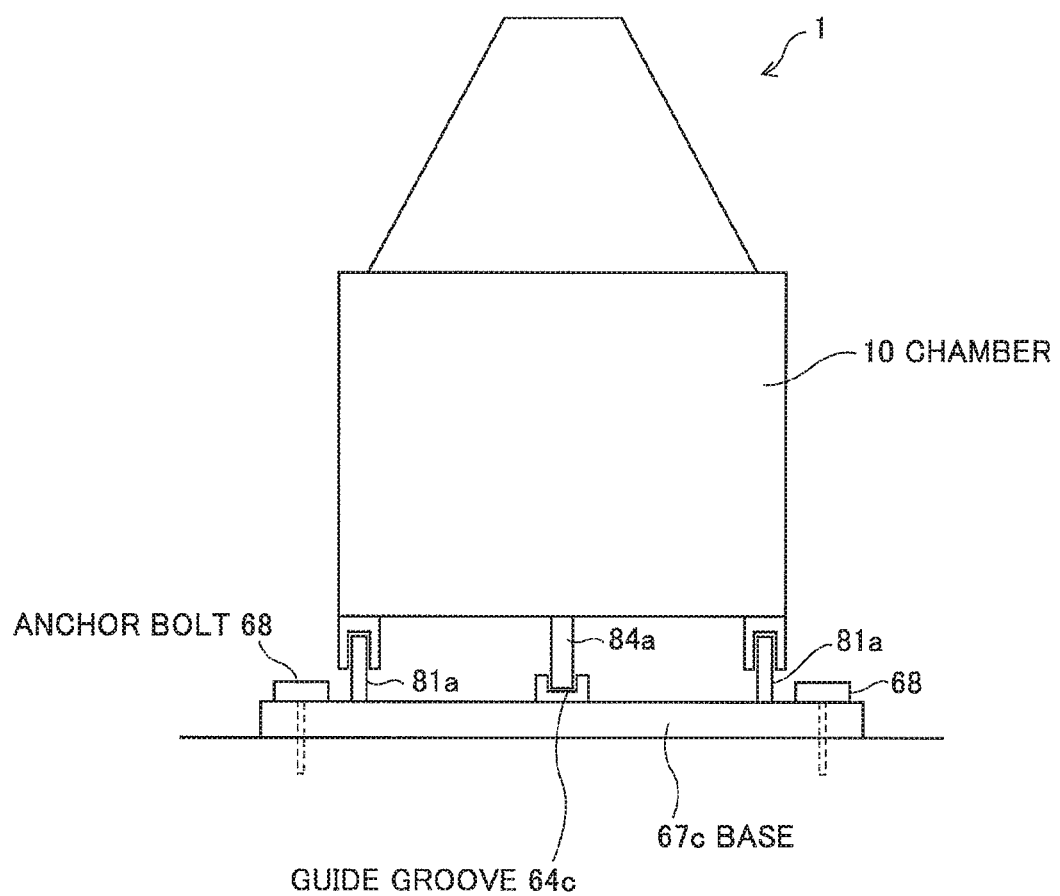
FIG. 18 is a rear view showing a sixteenth example related to the movement mechanism and the positioning mechanism of the EUV light source apparatus.

According to the second example, the degree of freedom of movement of the chamber 10 in the maintenance area can be improved, and handling of the chamber 10 can be facilitated. In addition, as the configuration for regulating the traveling path of the chamber support 74a by the guide rails 64a, grooves for receiving the guide rails 64a may be formed on the lower surface of the chamber support 74a. Alternatively, as shown in FIG. 18, which will be explained later, protrusions may be provided on the lower surface of the chamber support 74a, and grooves for receiving the protrusions may be formed in the guide rails 64a.

Figure 5A:
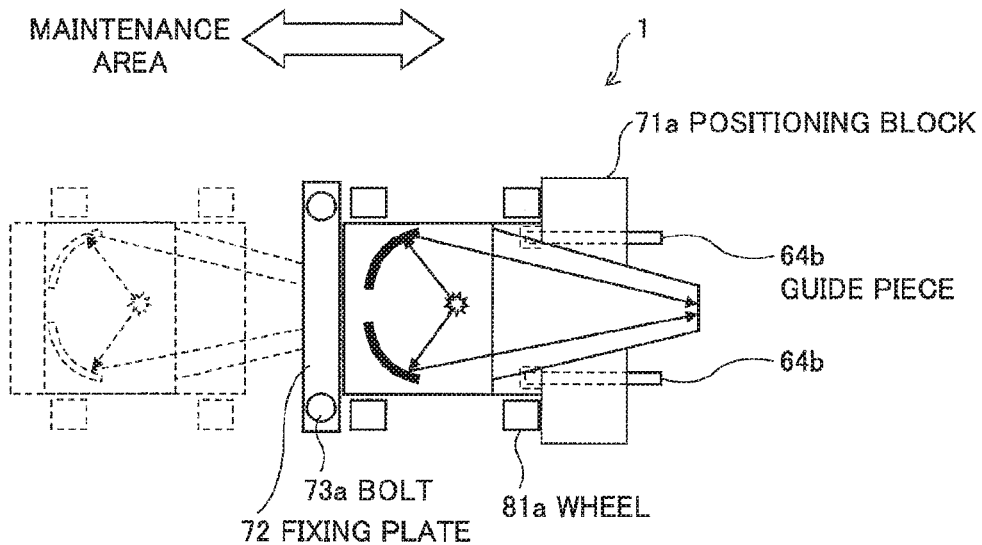
FIGS. 5A and 5B are a plan view and a side view showing a third example related to the movement mechanism and the positioning mechanism of the EUV light source apparatus.
Figure 5B:
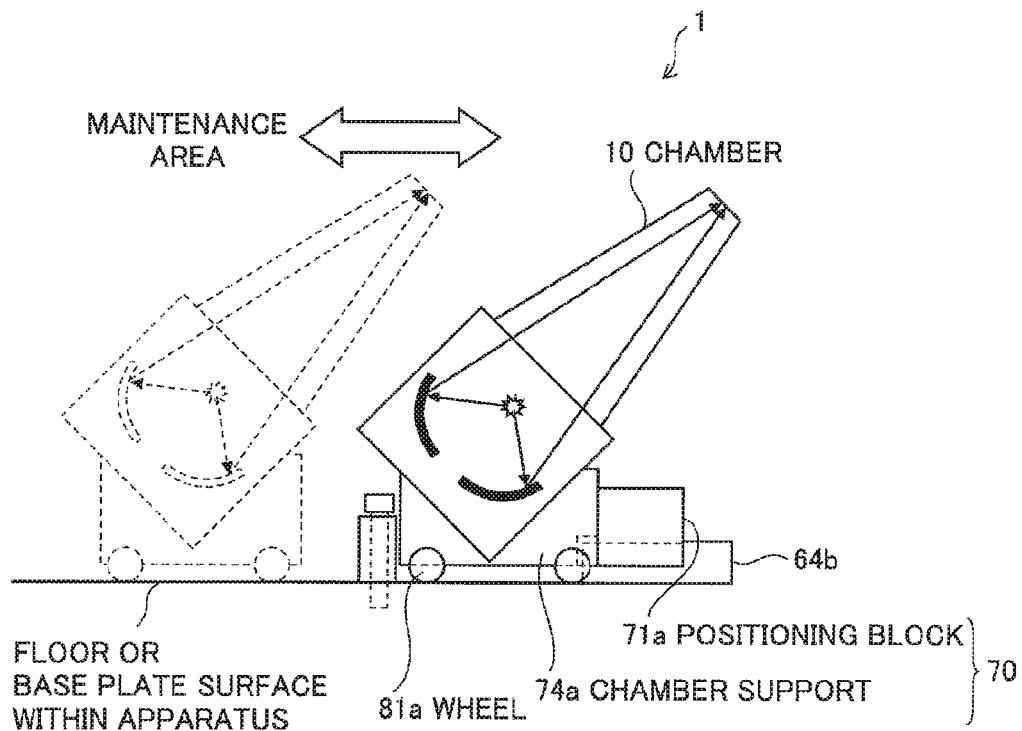

FIGS. 5A and 5B are a plan view and a side view showing a third example related to the movement mechanism and the positioning mechanism of the EUV light source apparatus.

As shown in FIGS. 5A and 5B, in the EUV light source apparatus 1 according to the third example, as the movement mechanism, wheels 81a are provided to the chamber support 74a. The chamber support 74a, on which the chamber 10 is mounted, moves as the wheels 81a roll on the floor. In the second example as shown in FIGS. 4A and 4B, the guide rails 64a are provided from the location of the positioning block 71a to the fixing location of the fixing plate 72. On the other hand, in the third example, guide pieces 64b are provided only near the location where the positioning block 71a is placed, and the guide pieces 64b are not provided to the fixing location of the fixing plate 72 and the maintenance area.

Therefore, in the third example, the chamber support 74a, on which the chamber 10 is mounted, can travel without regulation of the guide pieces 64b. The guide pieces 64b position the chamber support 74a in a direction perpendicular to the traveling direction by the wheels 81a. Positioning of the chamber support 74a in a direction in parallel to the raveling direction by the wheels 81a is performed by the positioning block 71a in contact with the front end of the chamber support 74a and the fixing plate 72 in contact with the rear end of the chamber support 74a. Alternatively, instead of the positioning block 71a, the same positioning member as the fixing plate 72 may be fixed in the location in contact with the front end of the chamber support 74a.

According to the third example, the degree of freedom of movement of the chamber 10 except in the case requiring positioning can be improved, and handling of the chamber 10 can be facilitated. Note that, in order to position the chamber 10 by using the guide pieces 64b, grooves for receiving the guide pieces 64b may be formed in the chamber support 74a with the chamber 10 mounted thereon, for example.

Figure 6A:
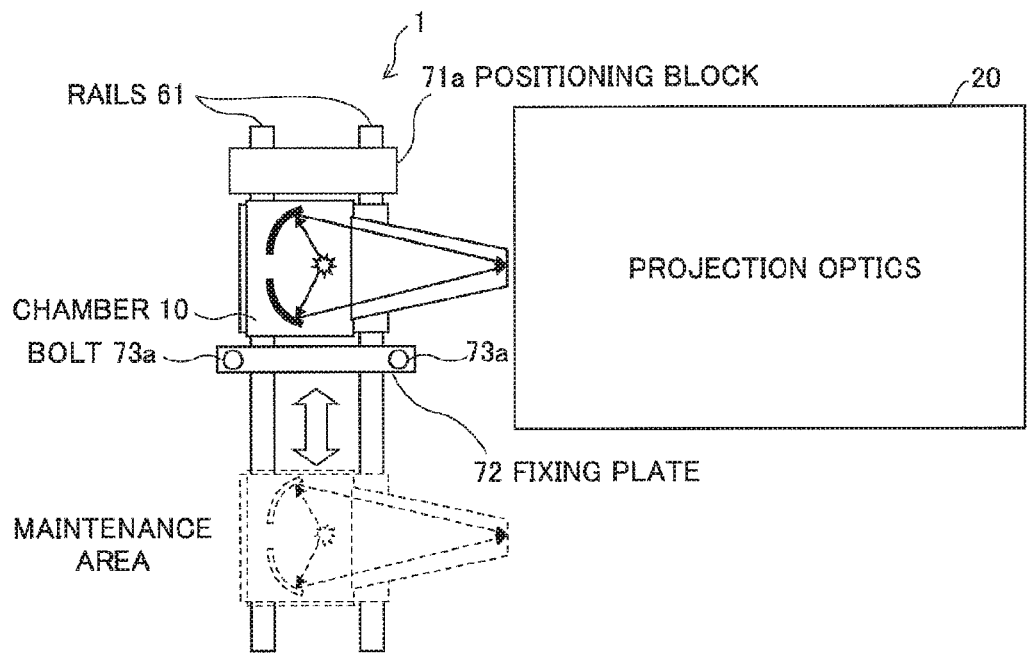
FIGS. 6A and 6B are a plan view and a side view showing a fourth example related to the movement mechanism and the positioning mechanism of the EUV light source apparatus.
Figure 6B:
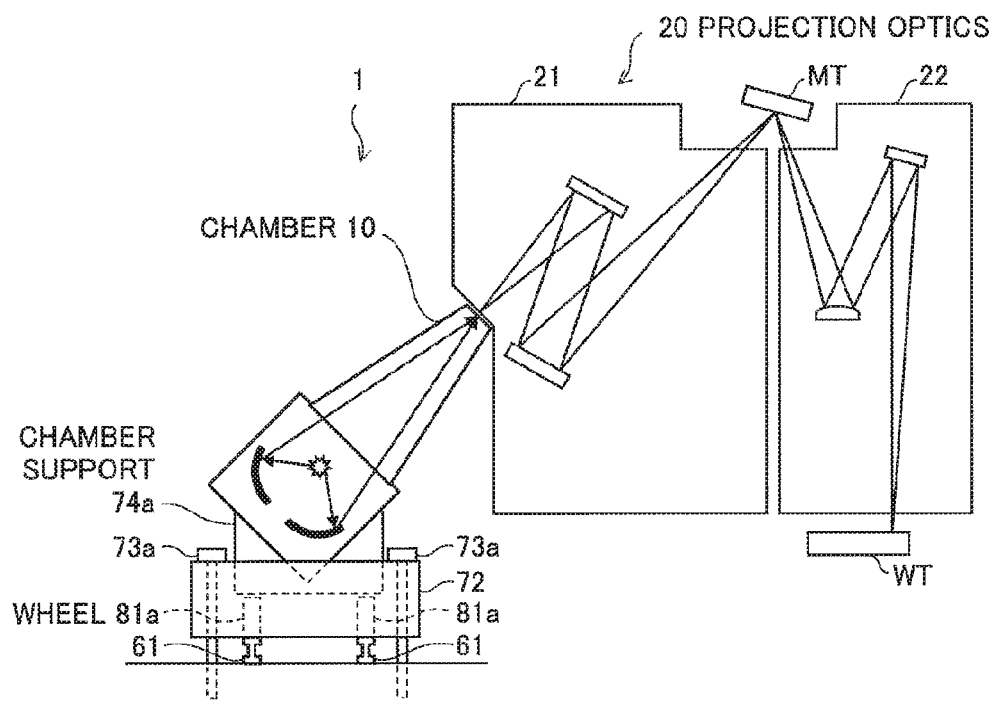

FIGS. 6A and 6B are a plan view and a side view showing a fourth example related to the movement mechanism and the positioning mechanism of the EUV light source apparatus.

As shown in FIGS. 6A and 6B, the EUV light source apparatus 1 according to the fourth example is different from the first example as shown in FIGS. 3A and 3B in that the chamber 10 moves in a direction crossing the direction toward the projection optics 20. Accordingly, in the fourth example, the rails 61 are placed in the direction crossing the direction toward the projection optics 20. Further, positioning of the chamber 10 in the direction crossing the direction toward the projection optics 20 is performed by the positioning block 71a and the fixing plate 72. The rest of the configuration is the same as that in the first example, and the chamber support 74a moves together with the chamber 10 as the wheels 81a roll along the rails 61. Although the example in which the chamber 10 moves to the right of the projection optics 20 (downwards in FIG. 6A) is shown, the chamber may move to the left (upwards in FIG. 6A).

Figure 7A:
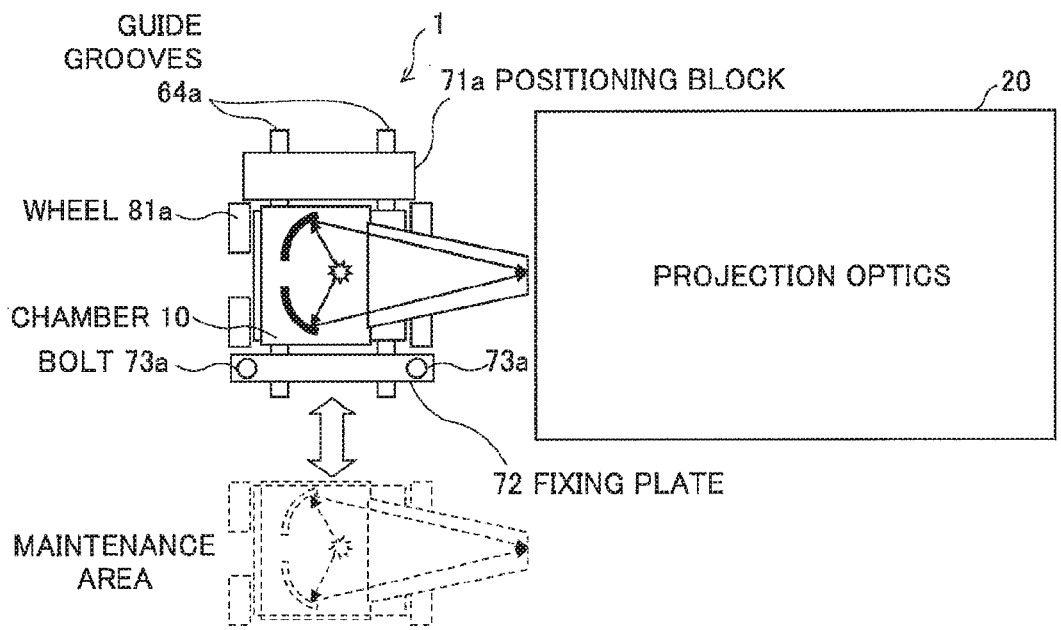
FIGS. 7A and 7B are a plan view and a side view showing a fifth example related to the movement mechanism and the positioning mechanism of the EUV light source apparatus.
Figure 7B:
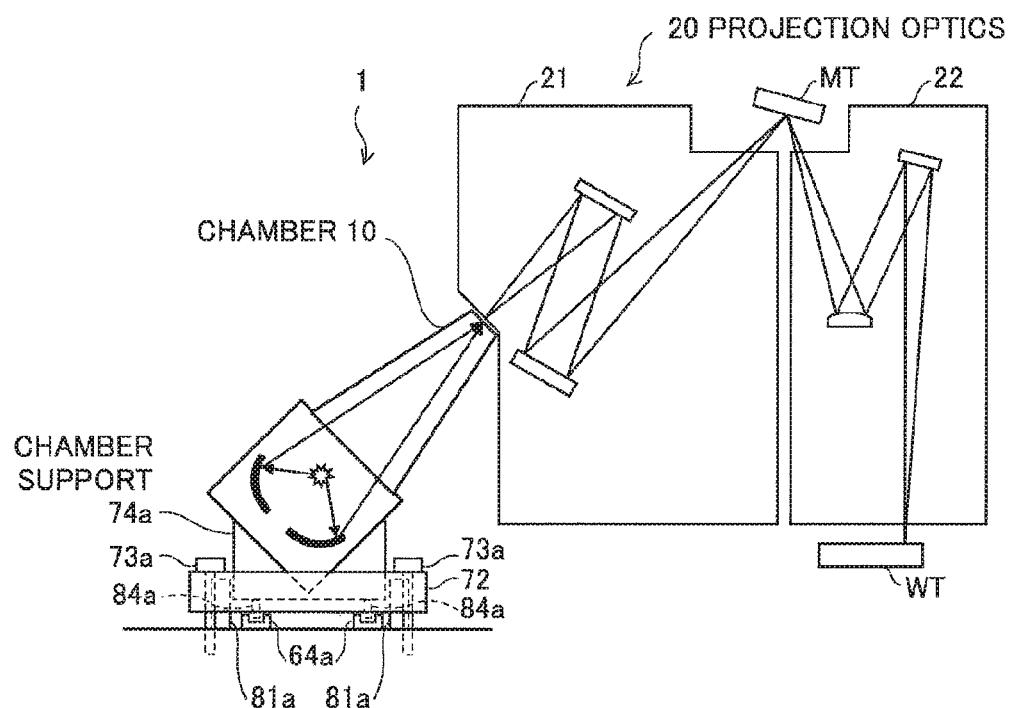

FIGS. 7A and 7B are a plan view and a side view showing a fifth example related to the movement mechanism and the positioning mechanism of the EUV light source apparatus.

As shown in FIGS. 7A and 7B, the EUV light source apparatus 1 according to the fifth example is different from the second example as shown in FIGS. 4A and 4B in that the chamber 10 moves in a direction crossing the direction toward the projection optics 20. Accordingly, in the fifth example, the guide rails 64a are placed in the direction crossing the direction toward the projection optics 20. Further, positioning of the chamber 10 in the direction crossing the direction toward the projection optics 20 is performed by the positioning block 71a and the fixing plate 72. The rest of the configuration is the same as that of the second example. The chamber 10 moves in a direction in parallel to the longitudinal direction of the guide rails 64a, and thereby, moves between a predetermined direction in contact with the positioning block 71a and the maintenance area where guide rails 64a are not provided. Although the example in which the chamber 10 moves to the right of the projection optics 20 (downwards in FIG. 7A) is shown, the chamber may move to the left (upwards in FIG. 7A).

Figure 8A:
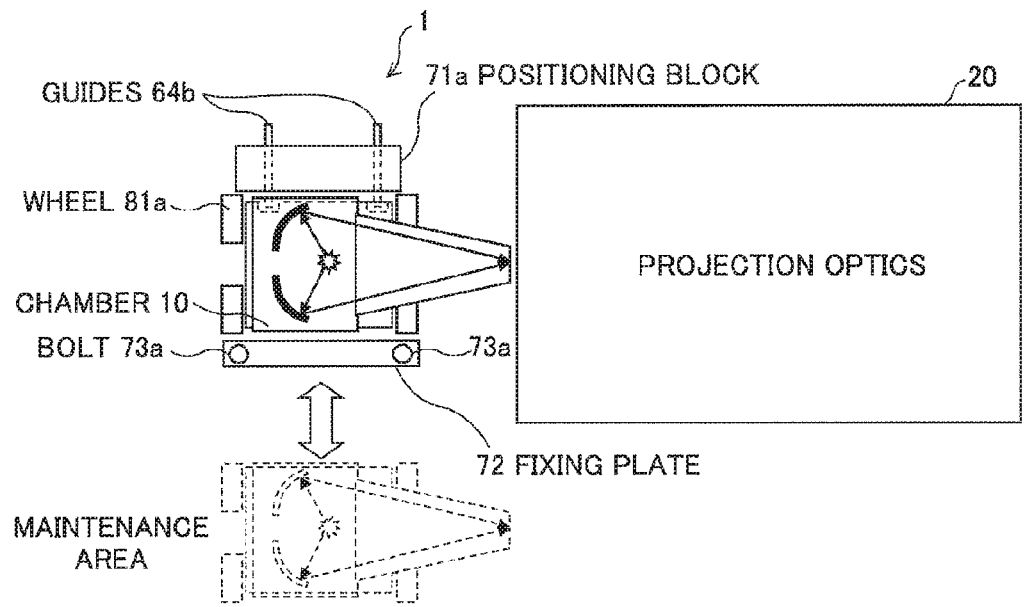
FIGS. 8A and 8B are a plan view and a side view showing a sixth example related to the movement mechanism and the positioning mechanism of the EUV light source apparatus.
Figure 8B:
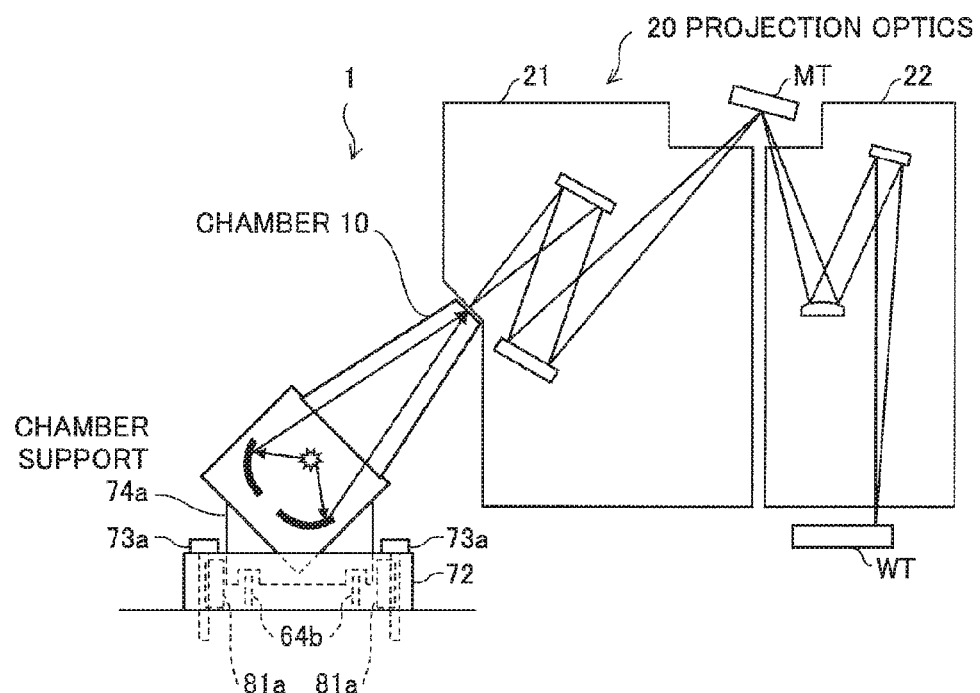

FIGS. 8A and 8B are a plan view and a side view showing a sixth example related to the movement mechanism and the positioning mechanism of the EUV light source apparatus.

As shown in FIGS. 8A and 8B, the EUV light source apparatus 1 according to the sixth example is different from the third example as shown in FIGS. 5A and 5B in that the chamber 10 moves in a direction crossing the direction toward the projection optics 20. Accordingly, in the sixth example, positioning of the chamber 10 in the direction crossing the direction toward the projection optics 20 is performed by the positioning block 71a and the fixing plate 72. The rest of the configuration is the same as that of the third example. The chamber 10 moves in the direction crossing the direction toward the projection optics 20, and thereby, moves between a predetermined direction in contact with the positioning block 71a and the maintenance area. Although the example in which the chamber 10 moves to the right of the projection optics 20 (downwards in FIG. 8A) is shown, the chamber may move to the left (upwards in FIG. 8A).

FIGS. 9A-9C are a plan view, a side view, and a rear view showing a seventh example related to the movement mechanism and the positioning mechanism of the EUV light source apparatus.

As shown in FIGS. 9A-9C, the EUV light source apparatus 1 according to the seventh example includes, as the movement mechanism 60, a crane 62 with wheels. The crane 62 hoists the chamber 10 and the wheels roll on the floor, and thereby, the chamber 10 is moved. The chamber 10 is provided with a hanging ring for hoisting by the crane 62. The hanging ring is provided in a location just above the center of gravity of the chamber 10 under the condition that the chamber 10 is positioned in a predetermined location where the optical axis of EUV light emitted from the EUV collector mirror 15 is aligned with the optical axis of the projection optics 20. Thereby, sudden inclination of the chamber can be prevented when the chamber is hoisted by the crane 62.

Further, the EUV light source apparatus 1 according to the seventh example includes, as the positioning mechanism 70, a positioning stage 74b fixed on the floor. The positioning stage 74b holds the chamber 10 in a posture oblique relative to the gravity direction such that the optical axis of EUV light emitted from the EUV collector mirror 15 is aligned with the optical axis of the projection optics 20. Since the positioning stage 74b is conformed to the shape of the chamber 10, when the chamber 10 is fitted in the positioning stage 74b, the chamber 10 can be correctly held in a posture in which the optical axis of EUV light emitted from the EUV collector mirror 15 is aligned with the optical axis of the projection optics 20. In addition, the chamber 10 may be positioned on the positioning stage 74b by providing positioning pins on the positioning stage 74b, or may be fixed onto the positioning stage 74b with bolts. At maintenance of the chamber 10, the chamber 10 is moved by the crane 62 to the location as shown by broken lines in FIGS. 9A and 9B.

The crane 62 may be permanently installed or brought in only for maintenance. Although the wheels of the crane 62 travel on the floor, the present invention is not limited to that, but rails may be provided on the floor for the wheels to travel on the rails. Furthermore, although the crane 62 is shown as an example of the movement mechanism 60, the present invention is not limited to that, but the chamber 10 may be lifted by a lifter and moved to the maintenance area. Moreover, although the positioning stage 74b fixed on the floor is shown as an example of the positioning mechanism 70, the present invention is not limited to that, but a six-axis stage for high-accuracy adjustment of the optical axis of the chamber 10 may be used.

Figure 10A:
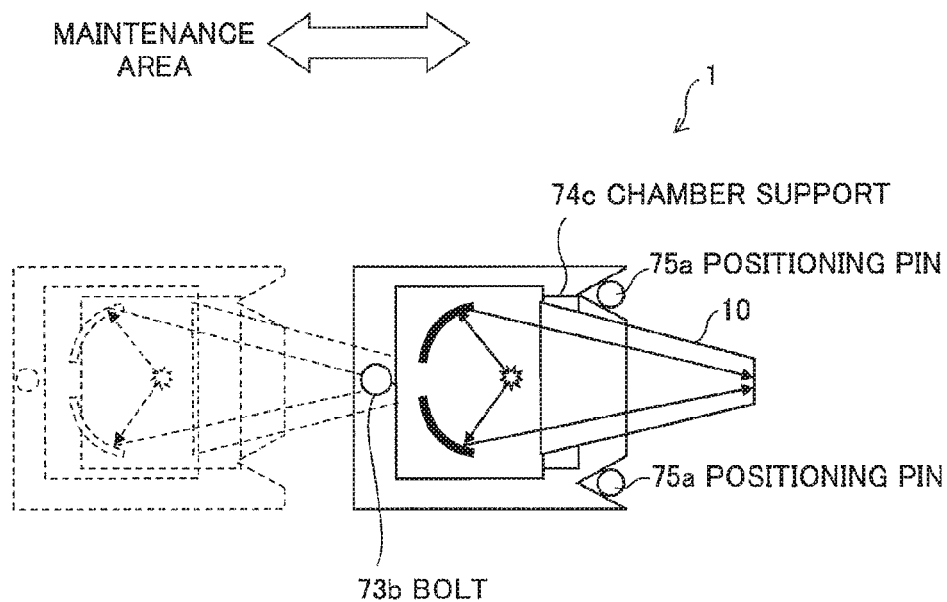
FIGS. 10A and 10B are a plan view and a side view showing an eighth example related to the movement mechanism and the positioning mechanism of the EUV light source apparatus.
Figure 10B:
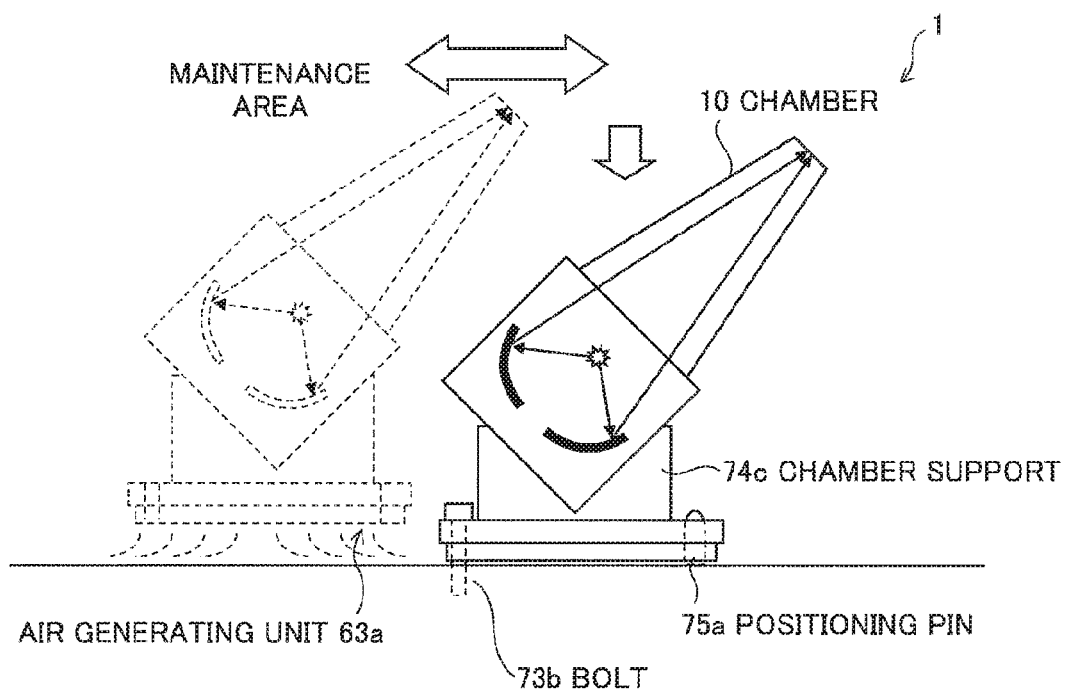

FIGS. 10A and 10B are a plan view and a side view showing an eighth example related to the movement mechanism and the positioning mechanism of the EUV light source apparatus.

As shown in FIGS. 10A and 10B, the EUV light source apparatus 1 according to the eighth example includes, as the movement mechanism 60, an air generating unit 63a provided on the lower surface of a chamber support 74c. The air generating unit 63a ejects air to the floor (installation surface) from the lower surface of the air generating unit 63a by using a fan or the like to slightly raise the chamber support 74c from the floor for moving the chamber support 74c with low friction.

Further, the EUV light source apparatus 1 according to the eighth example includes, as the positioning mechanism 70, two positioning pins 75a provided on the floor. The chamber support 74c is formed with notches for receiving the positioning pins 75a. When the chamber support 74c is moved along the floor toward the projection optics 20 and the positioning pins 75a are pressed against the notches of the chamber support 74c, the chamber support 74c is positioned together with the chamber 10. The chamber support 74c is further fixed to the floor by a bolt 73b. At maintenance of the chamber 10, the bolt 73b is detached, and the chamber support 74c is moved by the air generating unit 63a to the location as shown by the broken lines in FIGS. 10A and 10B.

According to the embodiment, the air generating unit 63a is used so that the chamber 10 can be moved by a simple configuration, and the chamber 10 can be positioned with high accuracy by using the simple positioning pins.

Although the two positioning pins 75a are provided, the present invention is not limited to that, but the larger number of positioning pins may be used. Further, for the positioning in the horizontal direction of the EUV chamber, positioning can be performed if locations of two points are determined, and therefore, not the positioning pins but blocks or plates that can determine the locations of two points may be used.

Figure 11A:
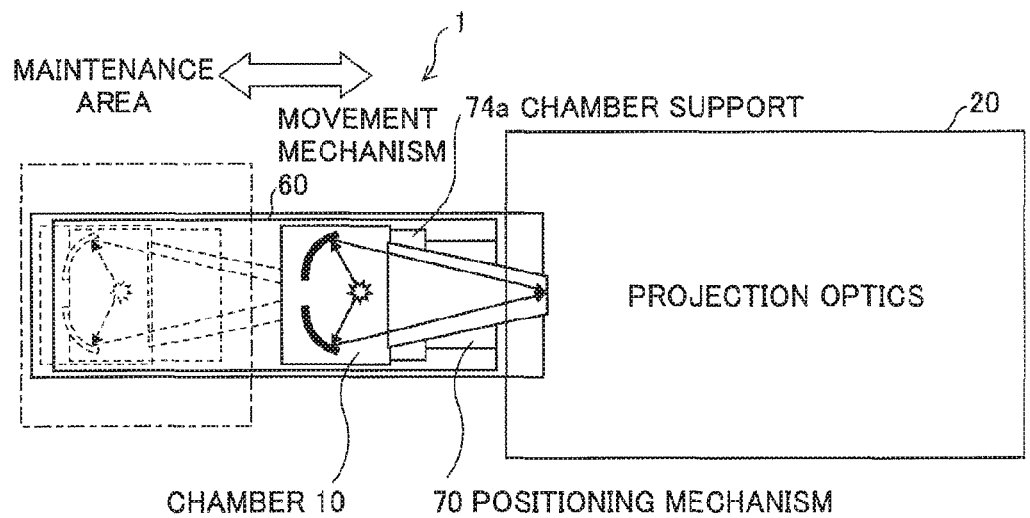
FIGS. 11A and 11B are a plan view and a side view showing a ninth example related to the movement mechanism and the positioning mechanism of the EUV light source apparatus.
Figure 11B:
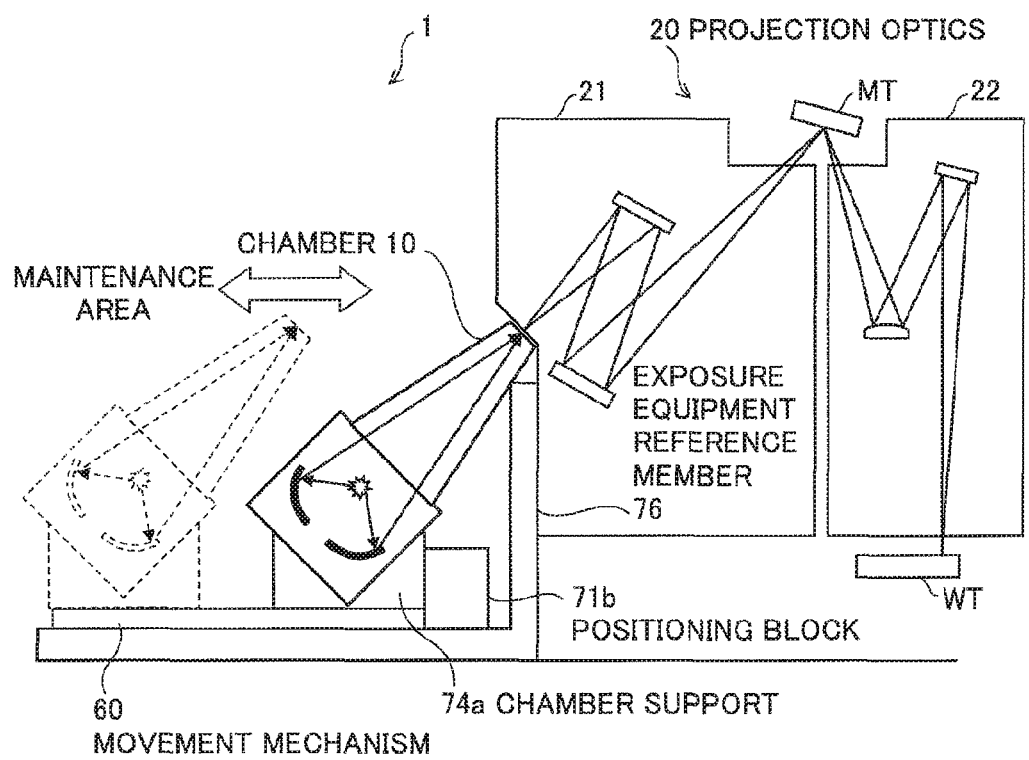

FIGS. 11A and 11B are a plan view and a side view showing a ninth example related to the movement mechanism and the positioning mechanism of the EUV light source apparatus.

As shown in FIGS. 11A and 11B, the EUV light source apparatus 1 according to the ninth example includes, as the positioning mechanism 70, an exposure equipment reference member 76 that also serves as a reference member for positioning the projection optics 20. That is, the exposure equipment reference member 76 is used as the reference for positioning the projection optics 20 and also used as the reference for positioning the chamber 10. The exposure equipment reference member 76 is a large member having two plate parts orthogonal to each other with an L-shaped section in the thickness direction. One plate part positions the projection optics 20 and the other plate part positions the chamber 10. The positioning of the chamber 10 is performed via the movement mechanism 60 and a positioning block 71b placed and fixed onto the exposure equipment reference member 76.

According to the configuration, the positioning accuracy of the chamber 10 relative to the projection optics 20 can be improved and variance in the positioning accuracy depending on the installation location can be reduced.

The configuration of the movement mechanism 60 is not specifically limited, but a configuration described in the other examples may be used. The positioning mechanism 70 is not limited to the positioning block 71b, but the mechanism described in the other examples may be used. The exposure equipment reference member 76 is not limited to the large member with the L-shaped section, but a member as reference such as small plates, pins, or the like may be placed in the projection optics 20, and the movement mechanism and the positioning mechanism of the chamber 10 may be placed with reference to the reference member.

Figure 12A:
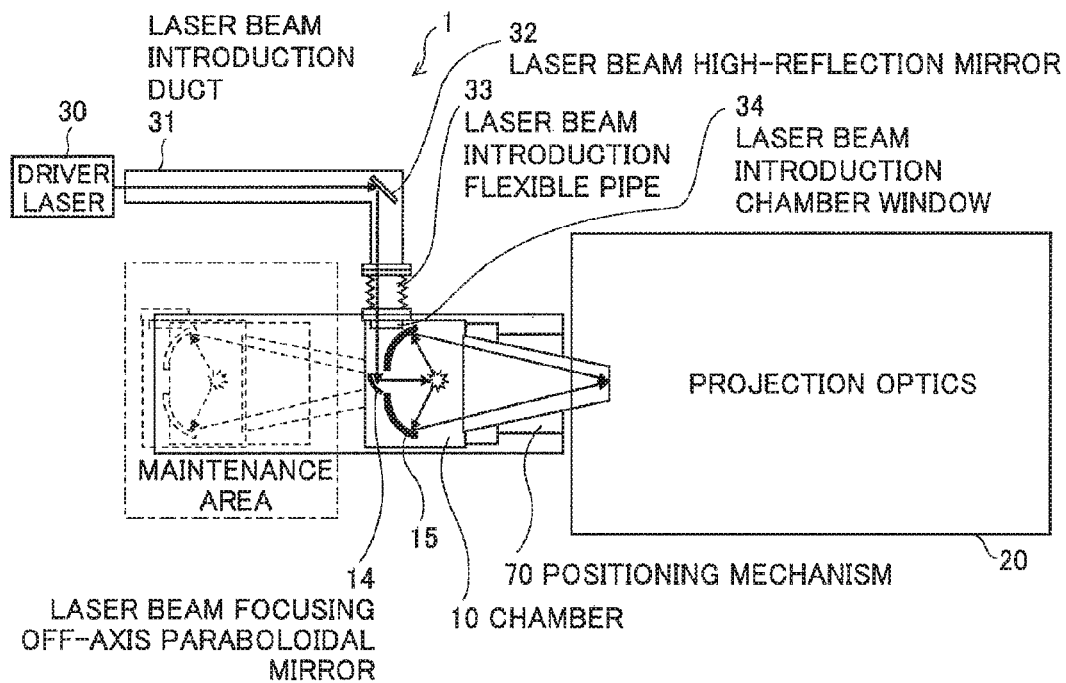
FIGS. 12A and 12B are a plan view and a side view showing a tenth example related to the movement mechanism and the positioning mechanism of the EUV light source apparatus.
Figure 12B:
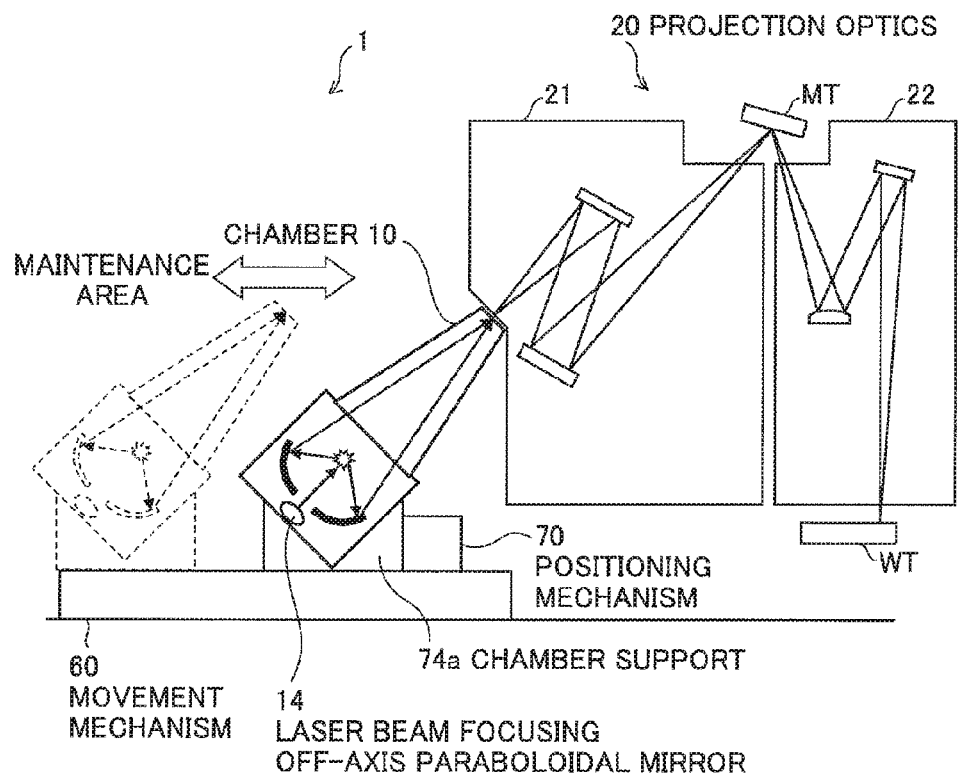

FIGS. 12A and 12B are a plan view and a side view showing a tenth example related to the movement mechanism and the positioning mechanism of the EUV light source apparatus.

As shown in FIGS. 12A and 12B, the EUV light source apparatus 1 according to the tenth example includes a laser beam introduction duct 31 for introducing a laser beam from the driver laser 30 provided outside of the chamber 10 into the chamber 10. The laser beam introduction duct 31 includes a laser beam high-reflection mirror 32, and a laser beam introduction flexible pipe 33. Further, the chamber 10 is provided with a laser beam introduction chamber window 34 for transmitting the laser beam, and a laser beam focusing off-axis paraboloidal mirror 14 for focusing the laser beam on the target material.

The laser beam emitted from the driver laser 30 passes through the laser beam introduction duct 31, is reflected by the laser beam high-reflection mirror 32 at an right angle, passes through the laser beam introduction flexible pipe 33, is transmitted through the laser beam introduction chamber window 34, and radiated into the chamber 10. Further, the laser beam is reflected by the laser beam focusing off-axis paraboloidal mirror 14, passes through an opening of the EUV collector mirror 15, and is focused to the target material.

At maintenance of the chamber 10, the laser beam introduction flexible pipe 33 is detached, and the chamber 10 is moved by the movement mechanism 60 to the location as shown by the broken lines in FIGS. 12A and 12B.

The embodiment is characterized in that the laser beam introduction duct 31 and the laser beam introduction flexible pipe 33 are provided outside the track on which the chamber is moved by the movement mechanism 60. Therefore, the laser beam introduction duct 31 and the laser beam introduction flexible pipe 33 are not an obstacle of the maintenance of the chamber 10. Further, even when the maintenance of the chamber 10 is done, the optical axis of the laser beam is not changed. Thus, if the chamber 10 is correctly positioned, it can be correctly positioned relative to both the optical axis of the laser beam and the optical axis of the projection optics 20.

Figure 13A:
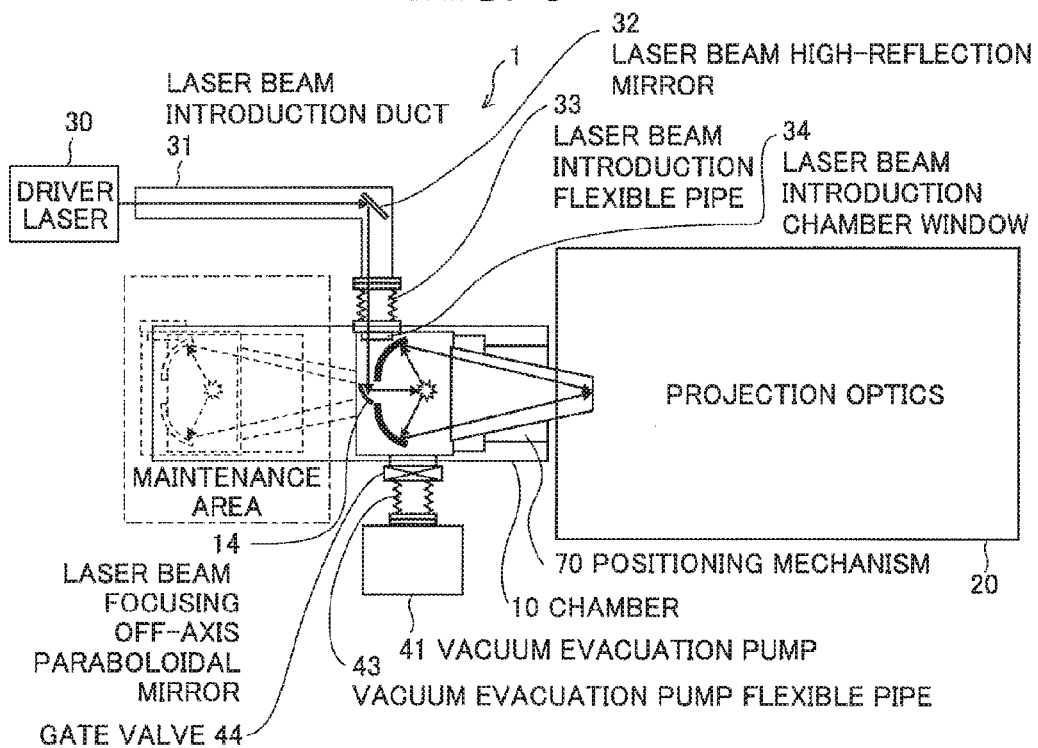
FIGS. 13A and 13B are a plan view and a side view showing an eleventh example related to the movement mechanism and the positioning mechanism of the EUV light source apparatus.
Figure 13B:
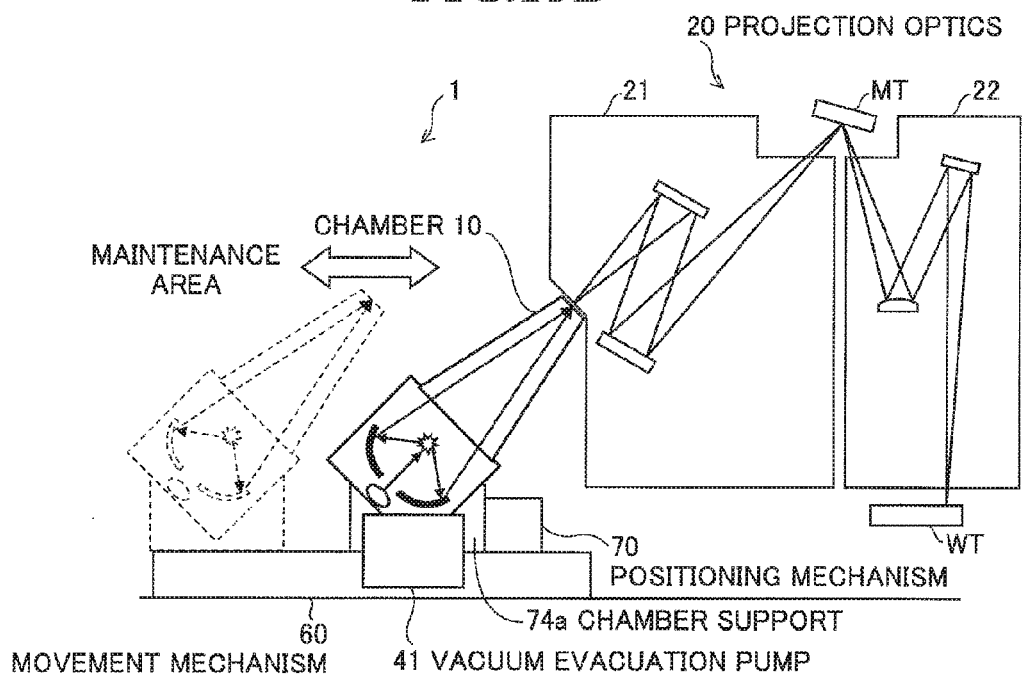

FIGS. 13A and 13B are a plan view and a side view showing an eleventh example related to the movement mechanism and the positioning mechanism of the EUV light source apparatus.

As shown in FIGS. 13A and 13B, the EUV light source apparatus 1 according to the eleventh example includes a vacuum evacuation pump 41 and a vacuum evacuation pump flexible pipe 43 outside of the chamber 10 in addition to the configuration of the tenth example. Further, the chamber 10 is provided with a gate valve 44 connected to the vacuum evacuation pump flexible pipe 43.

The vacuum evacuation pump 41 evacuates the air within the chamber 10 via the gate valve 44 and the vacuum evacuation pump flexible pipe 43, and thereby, provides a good environment for transmission of EUV light. Further, since the vacuum evacuation pump flexible pipe 43 is provided, the vibration of the vacuum evacuation pump 41 can be prevented from propagating to the chamber 10.

At maintenance of the chamber 10, the gate valve 44 is closed, and the vacuum evacuation pump flexible pipe 43 and the laser beam introduction flexible pipe 33 are detached, and the chamber 10 is moved by the movement mechanism 60 to the location as shown by the broken lines in FIGS. 13A and 13B.

The embodiment is characterized in that the vacuum evacuation pump 41 and the vacuum evacuation pump flexible pipe 43 are provided outside the track on which the chamber is moved by the movement mechanism 60. Therefore, the vacuum evacuation pump 41 and the vacuum evacuation pump flexible pipe 43 are not an obstacle of the maintenance of the chamber 10.

Figure 14A:
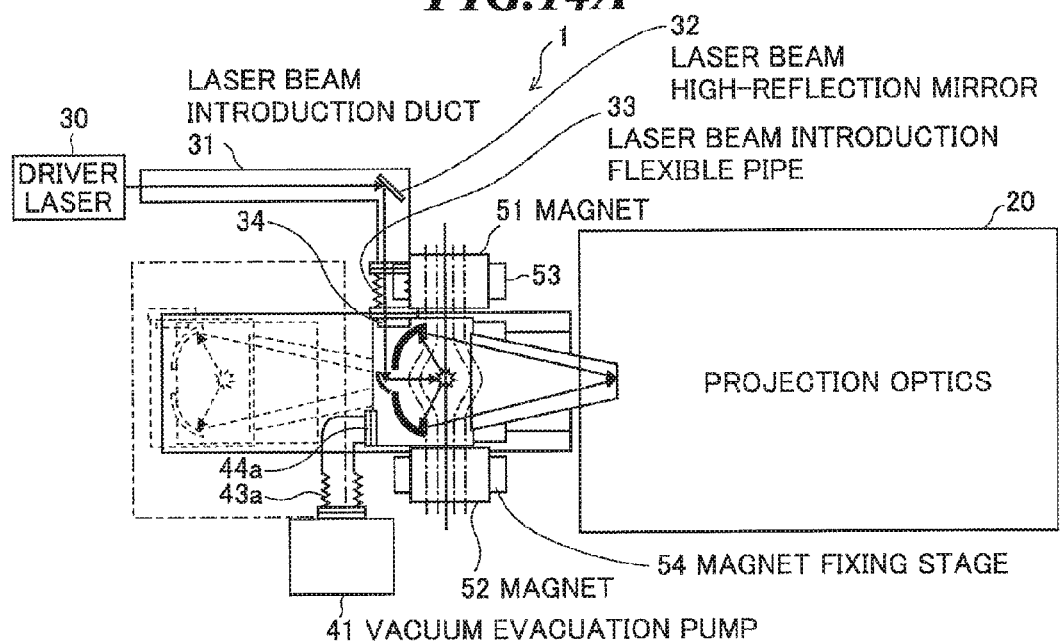
FIGS. 14A and 14B are a plan view and a side view showing a twelfth example related to the movement mechanism and the positioning mechanism of the EUV light source apparatus.
Figure 14B:
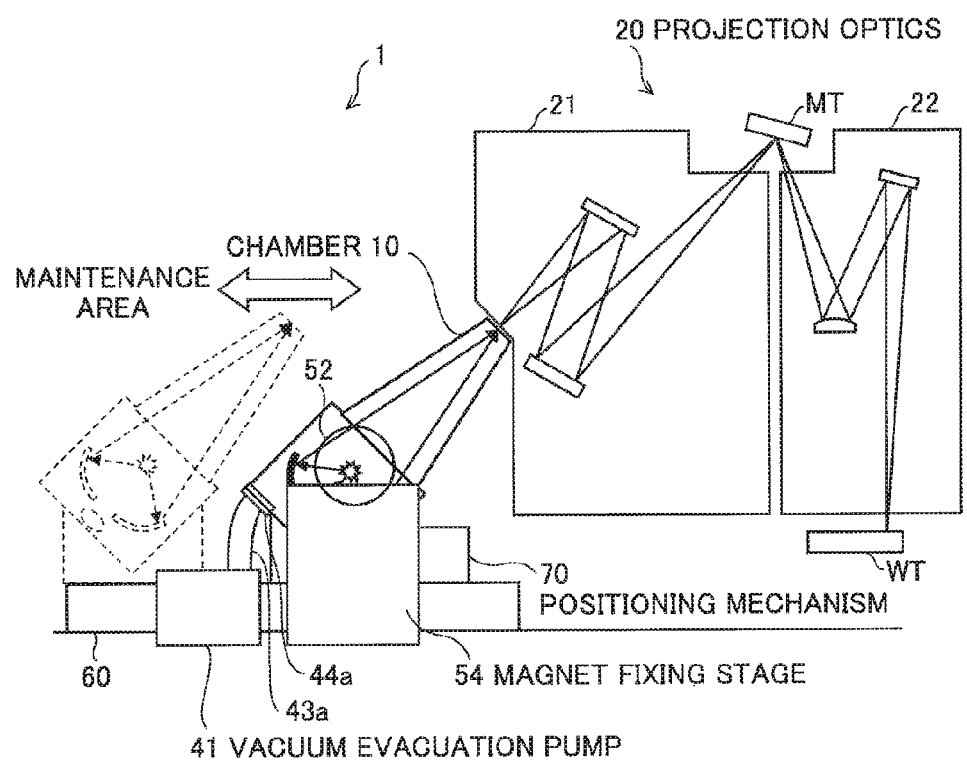

FIGS. 14A and 14B are a plan view and a side view showing a twelfth example related to the movement mechanism and the positioning mechanism of the EUV light source apparatus.

As shown in FIGS. 14A and 14B, the EUV light source apparatus 1 according to the twelfth example includes a pair of magnets 51 and 52 placed such that the magnetic field direction is along the horizontal direction, and magnet fixing stages 53 and 54 for fixing the magnets, outside of the chamber 10 in addition to the configuration of the eleventh example. The pair of magnets 51 and 52 are superconducting electromagnets for trapping charged particles radiated from plasma generated within the chamber 10 and preventing deterioration of the EUV collector mirror 15, and have large weights for generating a strong magnetic field.

At maintenance of the chamber 10, a gate valve 44a is closed, and a vacuum evacuation pump flexible pipe 43a and the laser beam introduction flexible pipe 33 are detached, and the chamber 10 is moved by the movement mechanism 60 to the location as shown by the broken lines in FIGS. 14A and 14B. Here, it is not necessary to move the magnets 51 and 52 and the magnet fixing stages 53 and 54.

The embodiment is characterized in that the pair of magnets 51 and 52 are provided separately from the chamber 10, outside the track on which the chamber is moved by the movement mechanism 60. Therefore, the magnets 51 and 52 are not obstacles of the maintenance of the chamber 10.

In the embodiment, the vacuum evacuation pump 41 is provided outside the track on which the chamber is moved by the movement mechanism 60 as is the case of the eleventh example. However, the pipe, which includes the vacuum evacuation pump flexible pipe 43a, for the vacuum evacuation pump 41 and the gate valve 44a are provided in an area partially overlapping the track on which the chamber is moved by the movement mechanism 60. At maintenance of the chamber 10, they can be retracted to the outside of the track on which the chamber is moved by the movement mechanism 60 by bending the vacuum evacuation pump flexible pipe 43a.

Figure 15A:
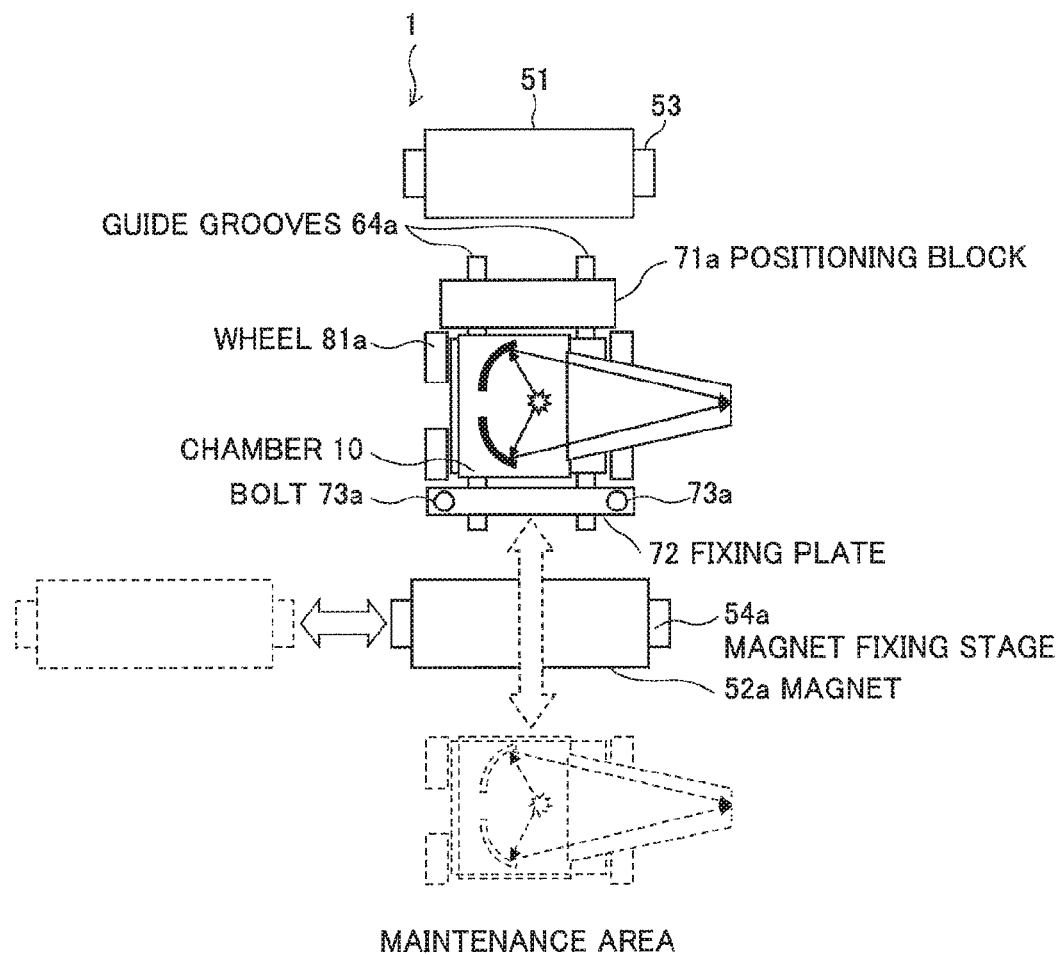
FIGS. 15A and 15B are a plan view and a side view showing a thirteenth example related to the movement mechanism and the positioning mechanism of the EUV light source apparatus.
Figure 15B:
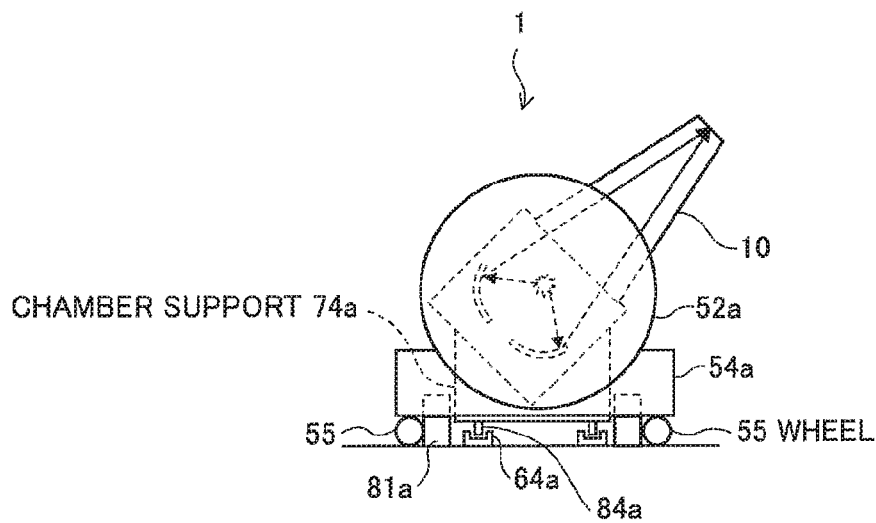

FIGS. 15A and 15B are a plan view and a side view showing a thirteenth example related to the movement mechanism and the positioning mechanism of the EUV light source apparatus.

As shown in FIGS. 15A and 15B, in the EUV light source apparatus 1 according to the thirteenth example, the chamber 10 moves in a direction crossing the direction toward the projection optics 20. Accordingly, wheels 55 are provided to a magnet fixing stage 54a with a magnet 52a mounted thereon so that the magnet 52a existing on the movement track of the chamber 10 can be retracted to the outside of the movement track of the chamber 10. In the thirteenth example, as the wheels 55 roll on the floor, the magnet fixing stage 54a can be moved in the direction crossing the movement track of the chamber 10. The configuration for moving and positioning the chamber 10 is the same as that of the fifth example as shown in FIGS. 7A and 7B. Although the example in which the magnet 52a is retracted to the outside of the movement track of the chamber 10 is shown, in the case where the vacuum evacuation pump or the other large parts are on the movement track of the chamber 10, they may be retracted. Further, although the example in which the magnet 52a is retracted and the chamber 10 is moved to the right of the projection optics 20 (downwards in FIG. 15A) is shown, the magnet 51 may be retracted and the chamber 10 may be moved to the left (upwards in FIG. 15A). Furthermore, the mechanism for moving the magnet 52a is not limited to the wheels 55, but rails or sliding bearings may be used.

Figure 16A:
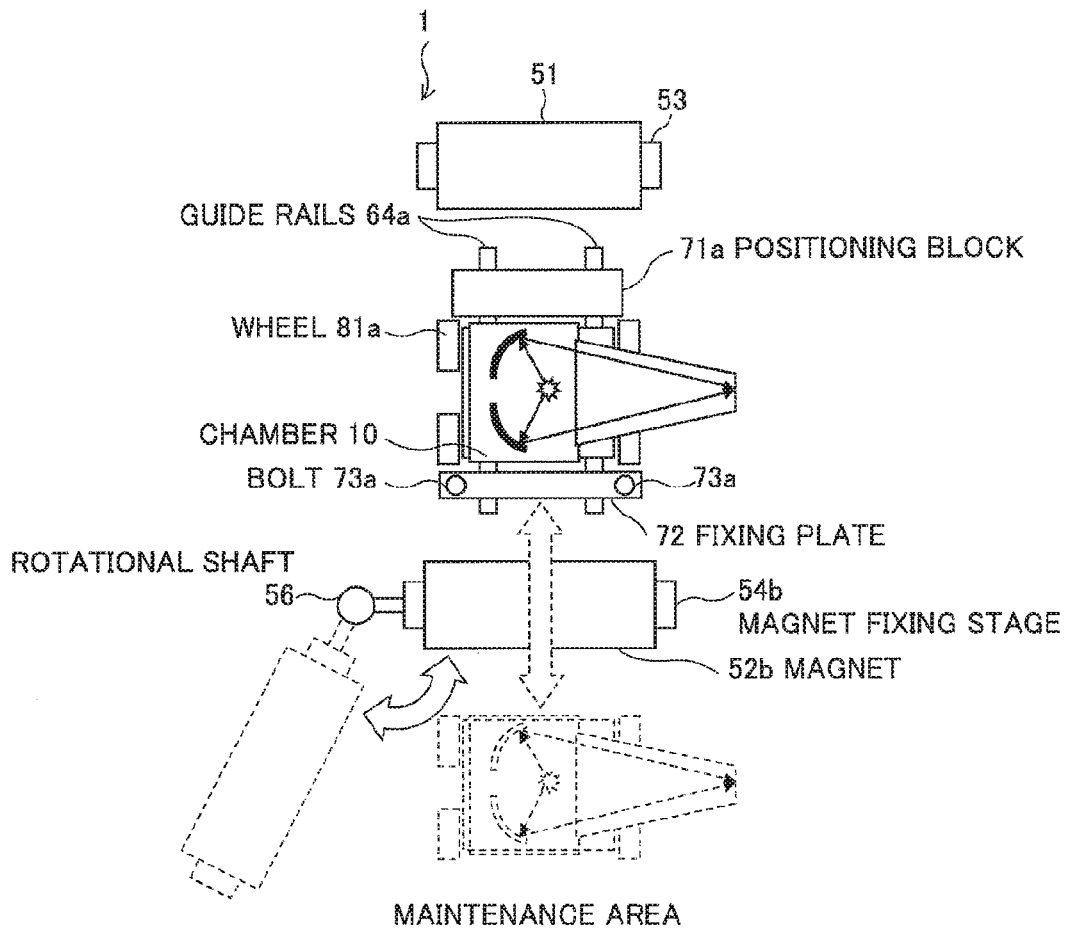
FIGS. 16A and 16B are a plan view and a side view showing a fourteenth example related to the movement mechanism and the positioning mechanism of the EUV light source apparatus.

FIGS. 16A and 163 are a plan view and a side view showing a fourteenth example related to the movement mechanism and the positioning mechanism of the EUV light source apparatus.

Figure 16B:
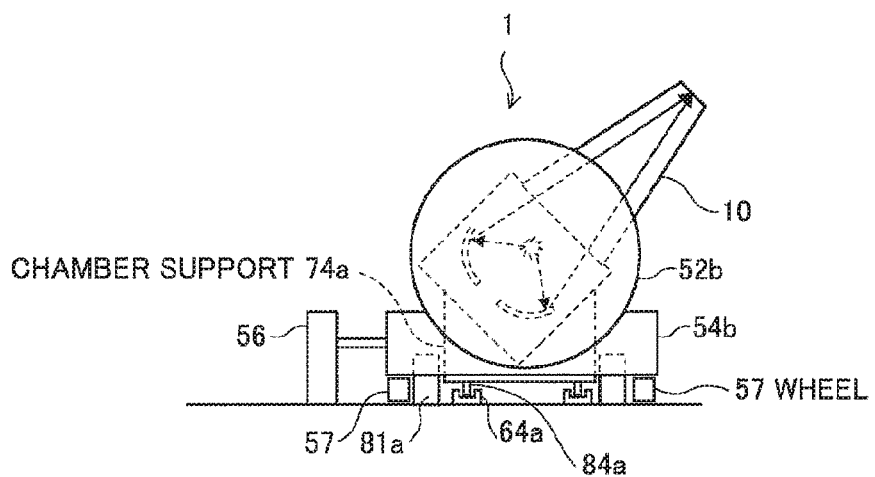

As shown in FIGS. 16A and 16B, in the EUV light source apparatus 1 according to the fourteenth example, the chamber 10 moves in a direction crossing the direction toward the projection optics 20. Accordingly, a rotational shaft 56 and wheels 57 are provided to a magnet fixing stage 54b with a magnet 52b mounted thereon so that the magnet 52b existing on the movement track of the chamber 10 can be retracted to the outside of the movement track of the chamber 10. In the fourteenth example, as the magnet fixing stage 54b is rotated around the rotational axis 56, the magnet fixing stage 54b can be moved. The configuration for moving and positioning the chamber 10 is the same as that of the fifth example as shown in FIGS. 7A and 7B. Although the example in which the magnet 52b is retracted to the outside of the movement track of the chamber 10 is shown, in the case where the vacuum evacuation pump or the other large parts are on the movement track of the chamber 10, they may be retracted. Further, although the example in which the magnet 52b is retracted and the chamber 10 is moved to the right of the projection optics 20 (downwards in FIG. 16A) is shown, the magnet 51 may be retracted and the chamber may be moved to the left (upwards in FIG. 16A). Furthermore, in place of the wheels 57, sliding bearings may be used.

FIG. 17 is a rear view showing a fifteenth example related to the movement mechanism and the positioning mechanism of the EUV light source apparatus.

As shown in FIG. 17, the EUV light source apparatus 1 according to the fifteenth example is similar to the first example in that the EUV light source apparatus 1 includes two parallel rails 61a as the movement mechanism 60, and the chamber 10 moves as wheels 81a roll along the rails 61a. On the other hand, the fifteenth example is different from the first example in that a run-off prevention guide formed with a run-off prevention guide groove 64 is additionally provided in parallel to the rails 61a, and a run-off prevention piece 84 slides to move in the run-off prevention guide groove 64 so as to prevent the run-off of the chamber 10. The rails 61a and the run-off prevention guide are fixed onto a movement mechanism installation base 67, and the movement mechanism installation base 67 is fixed to the floor by anchor bolts 68.

As the positioning mechanism to be used in the fifteenth example, the same configurations as the positioning block 71a and the fixing plate 72 in the first example may be used or the positioning mechanism 70 in the other examples may be used.

FIG. 18 is a rear view showing a sixteenth example related to the movement mechanism and the positioning mechanism of the EUV light source apparatus.

As shown in FIG. 18, the EUV light source apparatus 1 according to the sixteenth example is similar to the fifteenth example as shown in FIG. 17 in that the chamber 10 moves as wheels 81a attached to the chamber 10 roll, and a guide formed with a guide groove 64c is provided in parallel to the direction toward the projection optics 20 on a base 67c, and a protrusion 84a provided on the chamber 10 slides to move in the guide groove 64c so as to regulate the traveling path of the chamber. On the other hand, the sixteenth example is different from the fifteenth example in that the wheels 81a roll not on the rails but on the base 67c or the floor. The guide may be provided in the entire traveling path from the location where the chamber 10 is positioned to the maintenance area, or may be provided only in a part of the traveling path.

Figure 19:
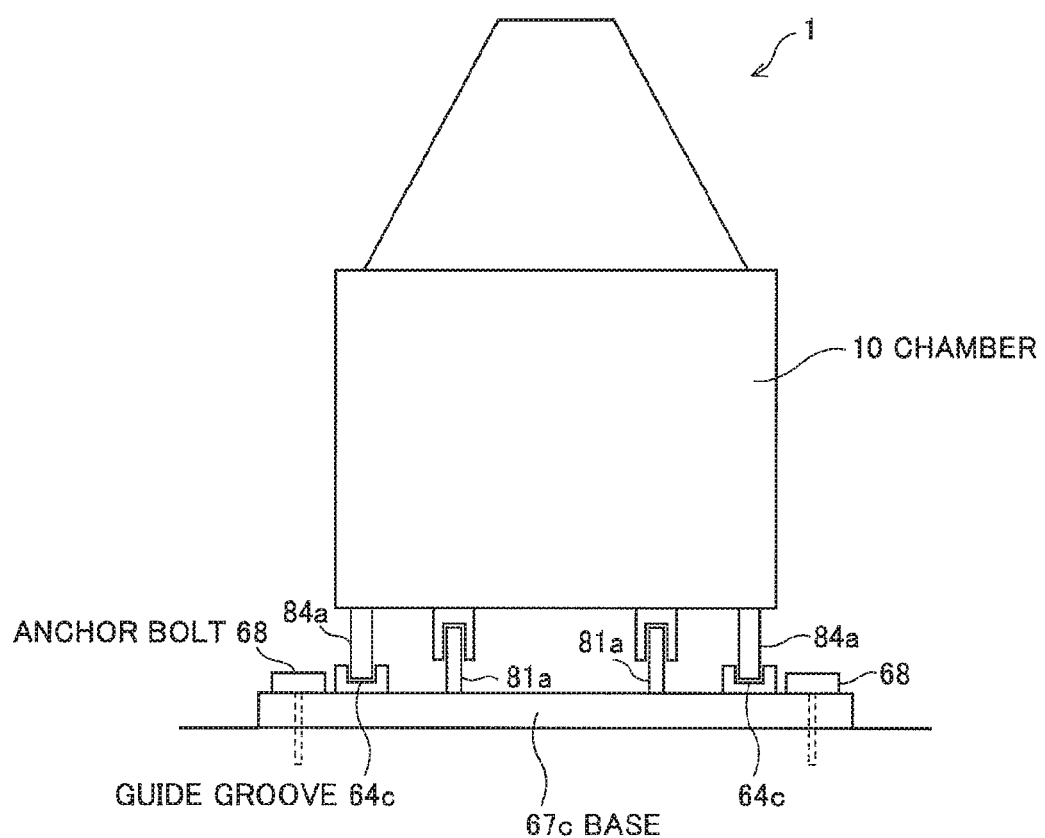
FIG. 19 is a rear view showing a seventeenth example related to the movement mechanism and the positioning mechanism of the EUV light source apparatus.

FIG. 19 is a rear view showing a seventeenth example related to the movement mechanism and the positioning mechanism of the EUV light source apparatus.

As shown in FIG. 19, the EUV light source apparatus 1 according to the seventeenth example is different from the sixteenth example as shown in FIG. 18 in that two guides respectively formed with two guide grooves 64c are provided at the outer side than the traveling path of the wheels 81a, and corresponding plural protrusions 84a are provided at the outer side than the wheels 81a, and the wheels 81a are provided at the inner side thereof. The rest of the configuration is the same as that of the sixteenth example.

Figure 20:
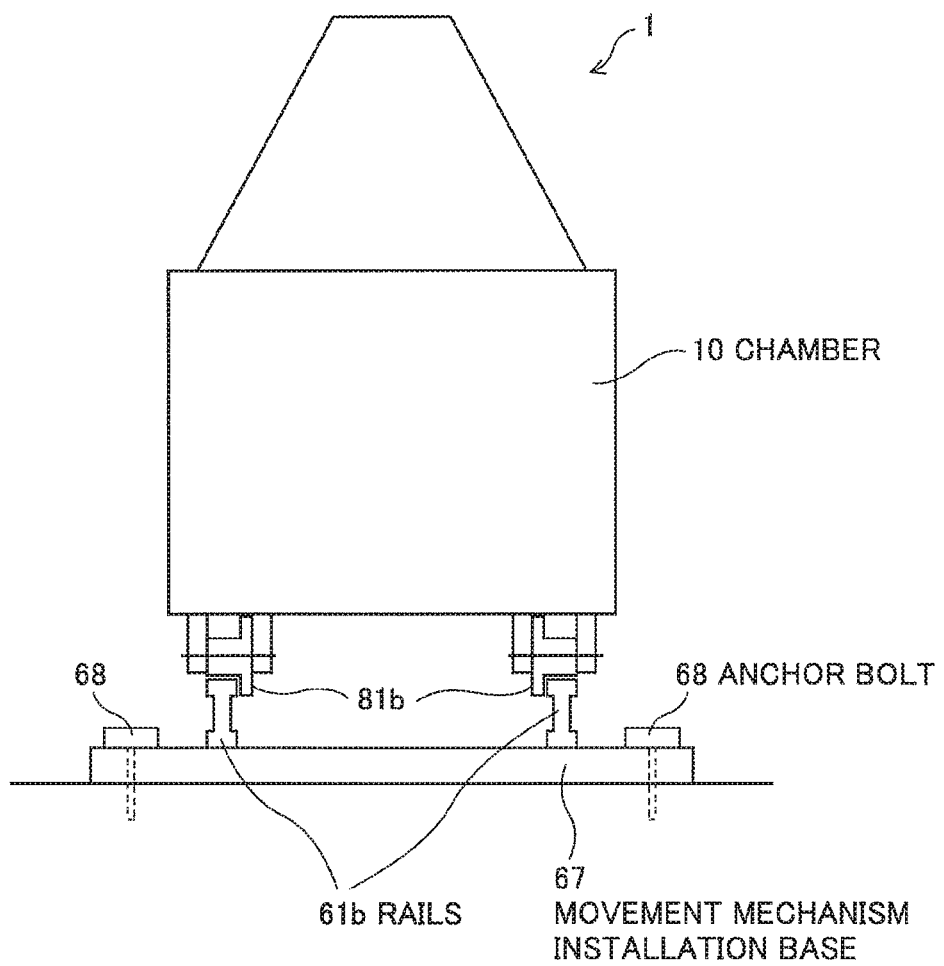
FIG. 20 is a rear view showing an eighteenth example related to the movement mechanism and the positioning mechanism of the EUV light source apparatus.

FIG. 20 is a rear view showing an eighteenth example related to the movement mechanism and the positioning mechanism of the EUV light source apparatus.

As shown in FIG. 20, the EUV light source apparatus 1 according to the eighteenth example is similar to the first example in that the EUV light source apparatus 1 includes two parallel rails 61b as the movement mechanism 60, and the chamber 10 moves as wheels 81b roll along the rails 61b. On the other hand, the eighteenth example is different from the first example in that the run-off of the chamber 10 is prevented by flanges formed on the side surfaces of the wheels 81b. The rails 61b are fixed onto the movement mechanism installation base 67, and the movement mechanism installation base 67 is fixed to the floor by the anchor bolts 68.

As the positioning mechanism 70 to be used in the eighteenth example, the same configurations as the positioning block 71a and the fixing plate 72 in the first example may be used or the positioning mechanism 70 in the other examples may be used.

Figure 21:
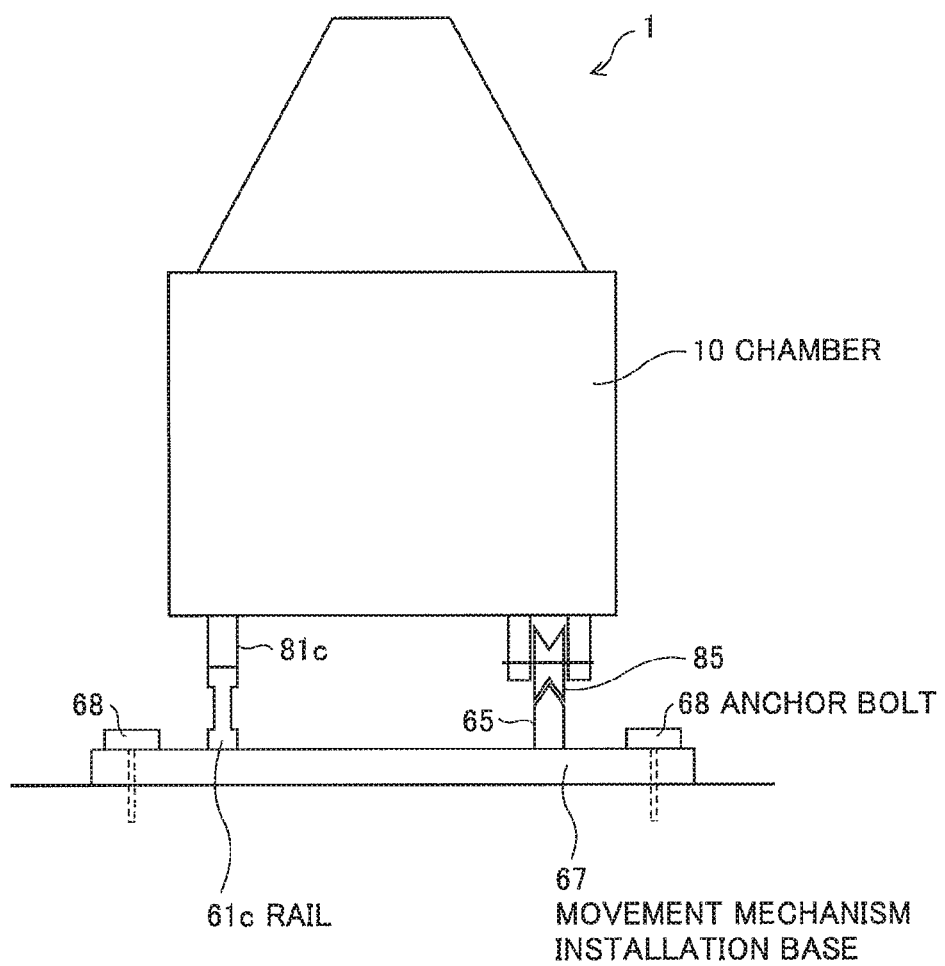
FIG. 21 is a rear view showing a nineteenth example related to the movement mechanism and the positioning mechanism of the EUV light source apparatus.

FIG. 21 is a rear view showing a nineteenth example related to the movement mechanism and the positioning mechanism of the EUV light source apparatus.

As shown in FIG. 21, the EUV light source apparatus 1 according to the nineteenth example is similar to the first example in that the EUV light source apparatus 1 includes two parallel rails 61c and 65 as the movement mechanism 60, and the chamber 10 moves as a wheel 81c rolls along the rail 61c and a wheel 85 rolls along the rail 65. On the other hand, the nineteenth example is different from the first example in that the section perpendicular to the longitudinal direction of the rail 65 within the rails 61c and 65 has a convex or concave shape, the section along the diameter of the wheel 85 rolling along the rail 65 has a concave or convex shape corresponding to the rail 65, and thereby, the run-off of the chamber 10 is prevented. The rails 61c and 65 are fixed onto the movement mechanism installation base 67 and the movement mechanism installation base 67 is fixed to the floor by the anchor bolts 68.

As the positioning mechanism 70 to be used in the nineteenth example, the same configurations as the positioning block 71a and the fixing plate 72 in the first example may be used or the positioning mechanism 70 in the other examples may be used.

Figure 22:
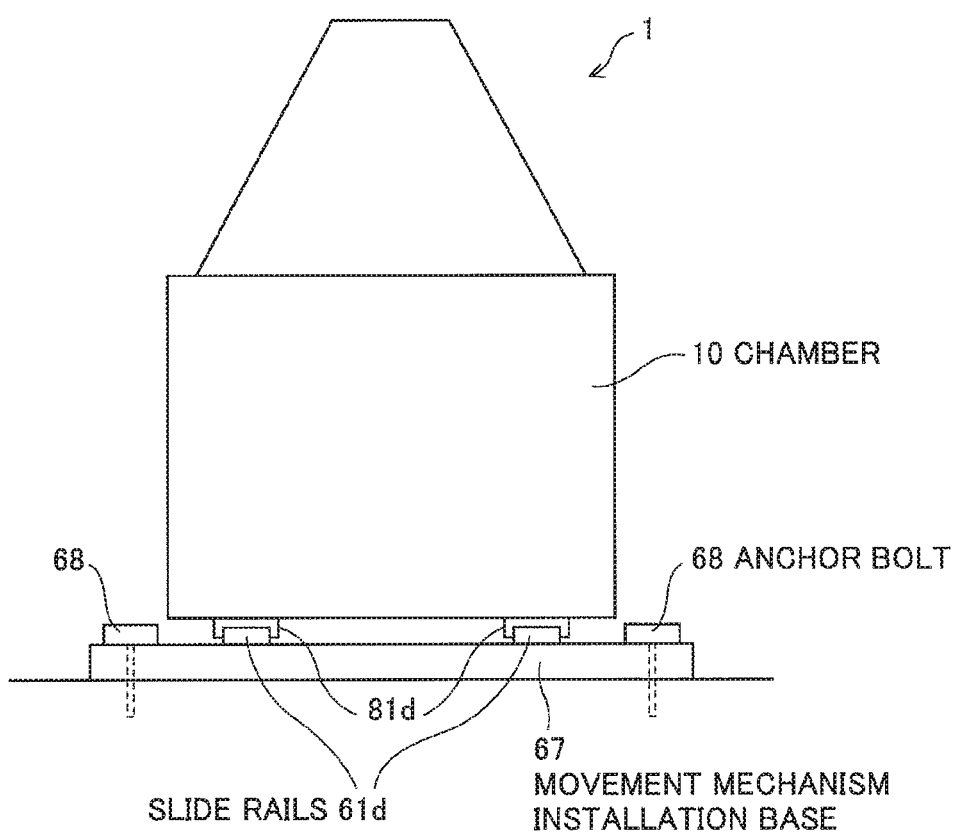
FIG. 22 is a rear view showing a twentieth example related to the movement mechanism and the positioning mechanism of the EUV light source apparatus.

FIG. 22 is a rear view showing a twentieth example related to the movement mechanism and the positioning mechanism of the EUV light source apparatus.

As shown in FIG. 22, the EUV light source apparatus 1 according to the twentieth example is similar to the first example in that the EUV light source apparatus 1 includes two parallel slide rails 61d as the movement mechanism 60 so that the chamber 10 moves. On the slide rails 61d in the twentieth example, slide blocks 81d are movably provided. Circulating balls are provided between the slide rails 61d and the slide blocks 81d, and so-called linear bearings are formed. The slide blocks 81d are fixed to the chamber 10, and the chamber 10 moves as the slide blocks 81d move. The slide rails 61d are fixed onto the movement mechanism installation base 67, and the movement mechanism installation base 67 is fixed to the floor by anchor bolts 68.

As the positioning mechanism to be used in the twentieth example, the same configurations as the positioning block 71a and the fixing plate 72 in the first example may be used or the positioning mechanism 70 in the other examples may be used.

Figure 23:
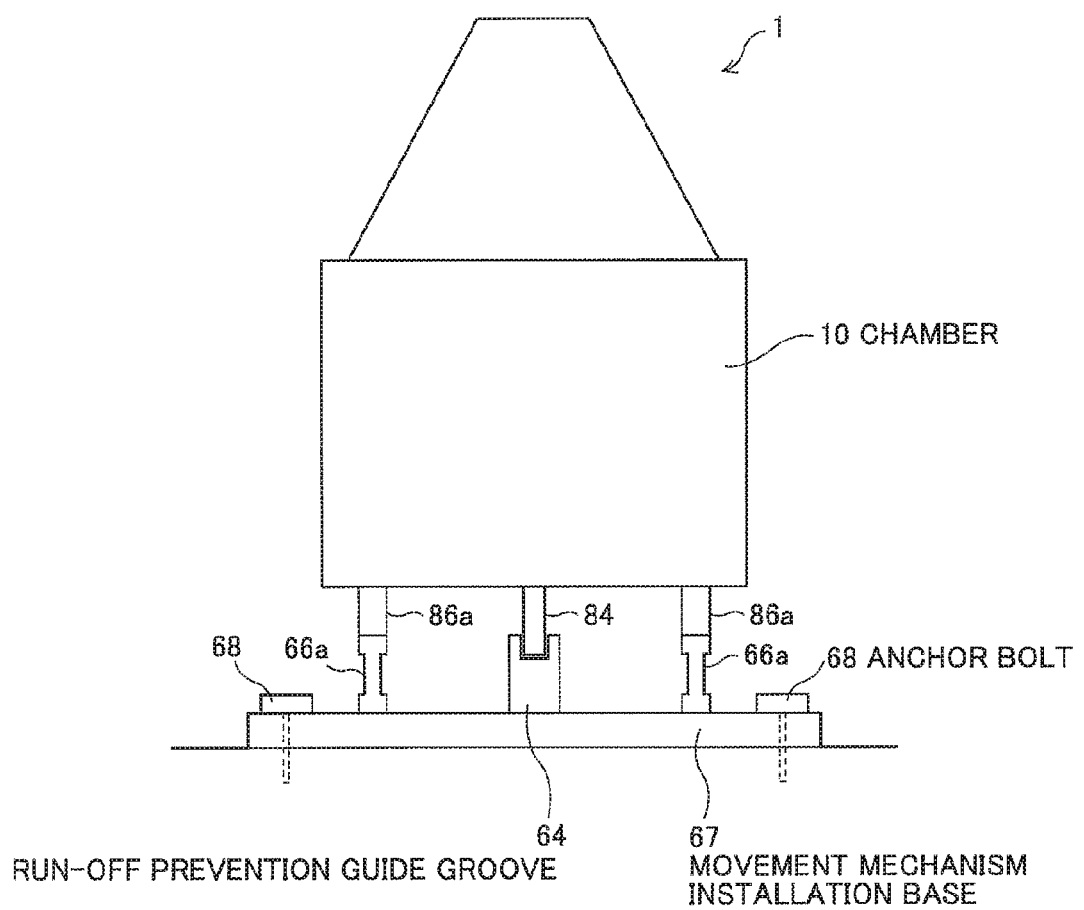
FIG. 23 is a rear view showing a twenty-first example related to the movement mechanism and the positioning mechanism of the EUV light source apparatus.

FIG. 23 is a rear view showing a twenty-first example related to the movement mechanism and the positioning mechanism of the EUV light source apparatus.

As shown in FIG. 23, the EUV light source apparatus 1 according to the twenty-first example employs rack-and-pinions and the same run-off prevention guide groove as that in the fifteenth example as the movement mechanism 60. That is, onto the movement mechanism installation base 67, two racks 66a formed by gear-cutting on one surface of each elongated flat plate and the run-off prevention guide formed with the run-off prevention guide groove 64 are fixed in parallel to one another. Further, circular gears (pinions) 86a having small diameters and axially supported by the chamber 10 rotationally move on the racks 66a while engaging with the racks 66a, and the run-off prevention piece 84 slides to move in the run-off prevention guide groove 64, and thereby, the run-off of the chamber 10 is prevented. The movement mechanism installation base 67 is fixed to the floor by anchor bolts 68.

As the positioning mechanism to be used in the twenty-first example, the same configurations as the positioning block 71a and the fixing plate 72 in the first example may be used or the positioning mechanism 70 in the other examples may be used.

Figure 24:
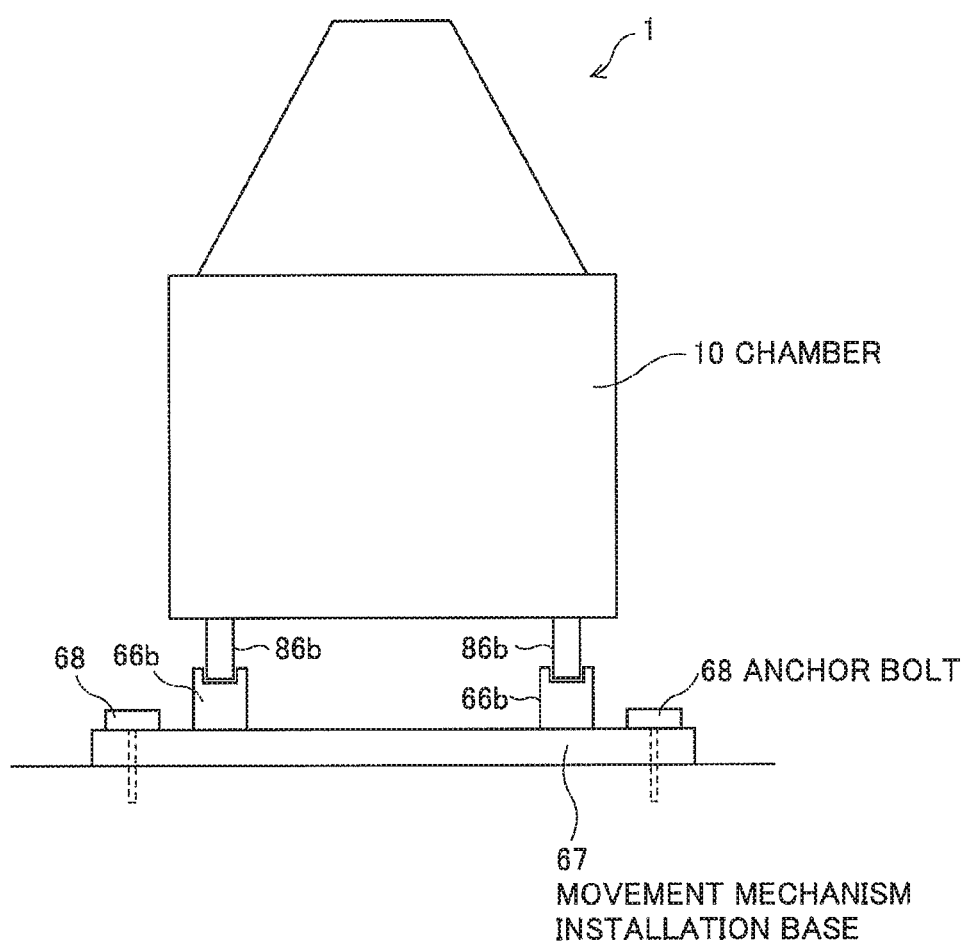
FIG. 24 is a rear view showing a twenty-second example related to the movement mechanism and the positioning mechanism of the EUV light source apparatus.
Figure 25:
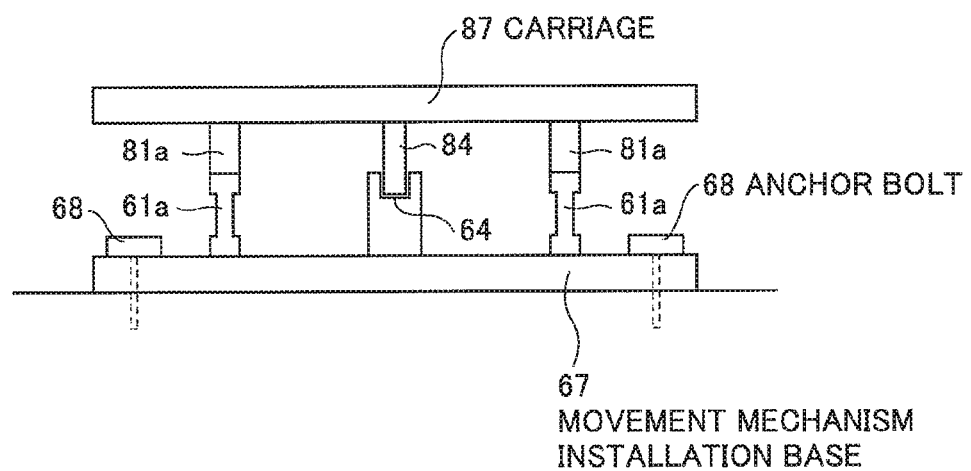
FIG. 25 is a rear view showing a twenty-third example related to the movement mechanism and the positioning mechanism of the EUV light source apparatus.
Figure 26:
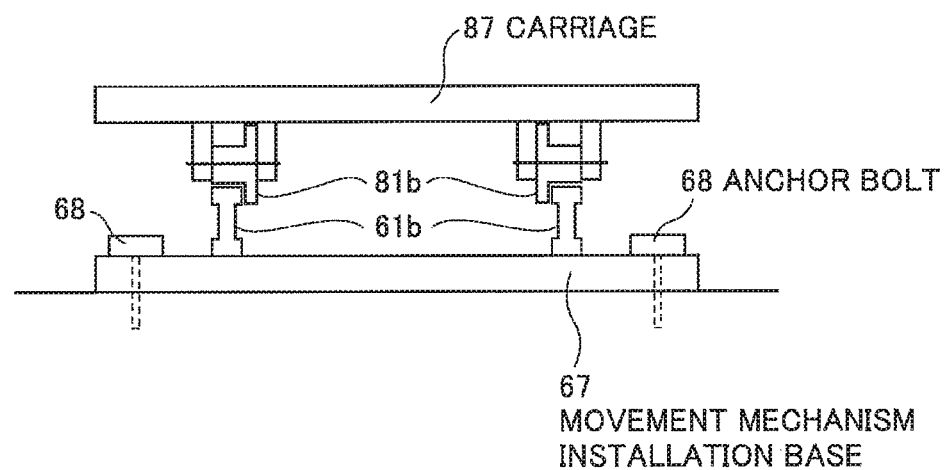
FIG. 26 is a rear view showing a twenty-fourth example related to the movement mechanism and the positioning mechanism of the EUV light source apparatus.
Figure 27:
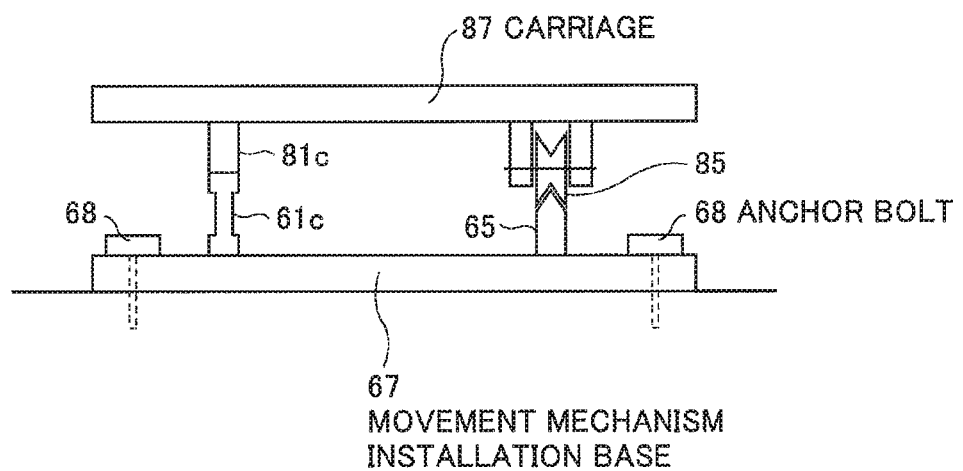
FIG. 27 is a rear view showing a twenty-fifth example related to the movement mechanism and the positioning mechanism of the EUV light source apparatus.
Figure 28:
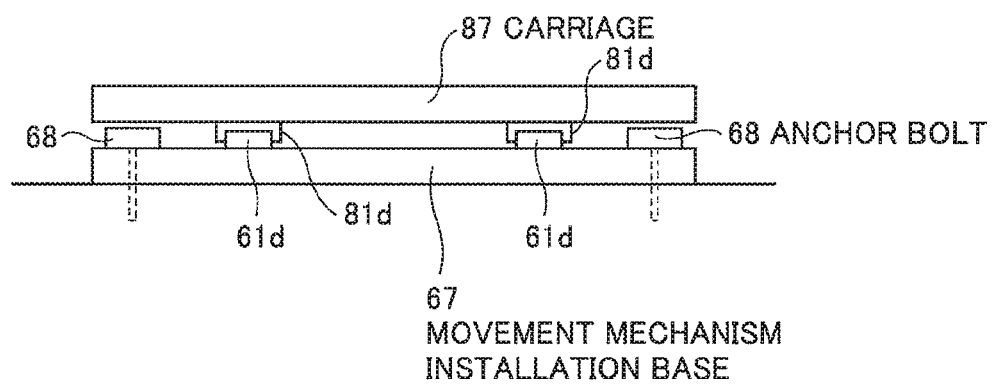
FIG. 28 is a rear view showing a twenty-sixth example related to the movement mechanism and the positioning mechanism of the EUV light source apparatus.
Figure 29:
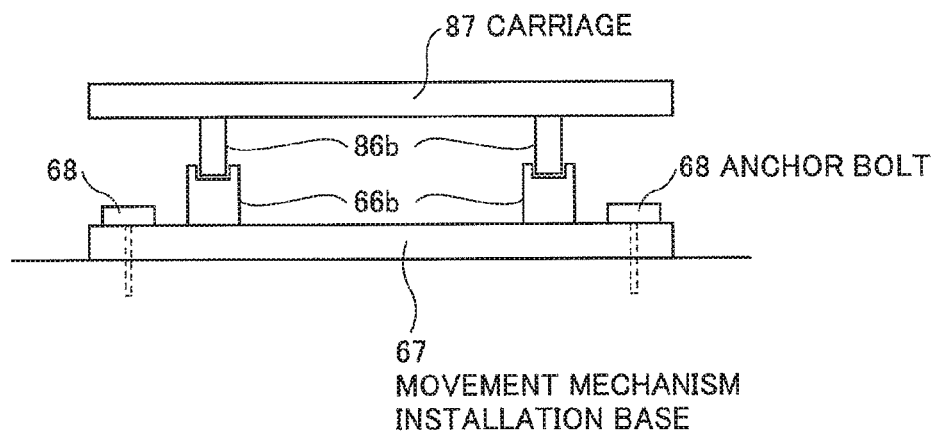
FIG. 29 is a rear view showing a twenty-seventh example related to the movement mechanism and the positioning mechanism of the EUV light source apparatus.

FIG. 24 is a rear view showing a twenty-second example related to the movement mechanism and the positioning mechanism of the EUV light source apparatus.

As shown in FIG. 24, the EUV light source apparatus 1 according to the twenty-second example is similar to the twenty-first example in that the EUV light source apparatus 1 employs rack-and-pinions as the movement mechanism 60. In the twenty-second example, racks 66b are of Riggenbach type having U-shaped sections, and the run-off of pinions 86b axially supported by the chamber 10 is prevented. Therefore, the run-off prevention guide groove 64 and the run-off prevention piece 84 as in the twenty-first example are not required. The racks 66b are fixed onto the movement mechanism installation base 67, and the movement mechanism installation base 67 is fixed to the floor by the anchor bolts 68.

As the positioning mechanism 70 to be used in the twenty-second example, the same configurations as the positioning block 71a and the fixing plate 72 in the first example may be used or the positioning mechanism 70 in the other examples may be used.

FIGS. 25-29 are rear views showing the twenty-third to twenty-seventh examples related to the movement mechanism and the positioning mechanism of the EUV light source apparatus, respectively.

As shown in FIGS. 25-29, the EUV light source apparatuses 1 according to the twenty-third to twenty-seventh examples respectively include the same configurations of the fifteenth to twentieth and the twenty-second examples with respect to the movement mechanism 60. In the fifteenth to twentieth and the twenty-second examples, the wheels 81a and the run-off prevention piece 84, the wheels 81b, the wheels 81c and 85, the slide blocks 81d, and the pinions 86b are axially supported by or fixed to the chamber 10. On the other hand, in the twenty-third to twenty-seventh examples, they are axially supported by or fixed to a carriage 87. Further, the chamber 10 is positioned on the carriage 87, and moves to the maintenance area as the carriage 87 moves.

As the positioning mechanisms for positioning the carriage 87 in the twenty-third to twenty-seventh examples, the same configurations as the positioning block 71a and the fixing plate 72 in the first example may be used or the positioning mechanism 70 in the other examples may be used.

Figure 30:
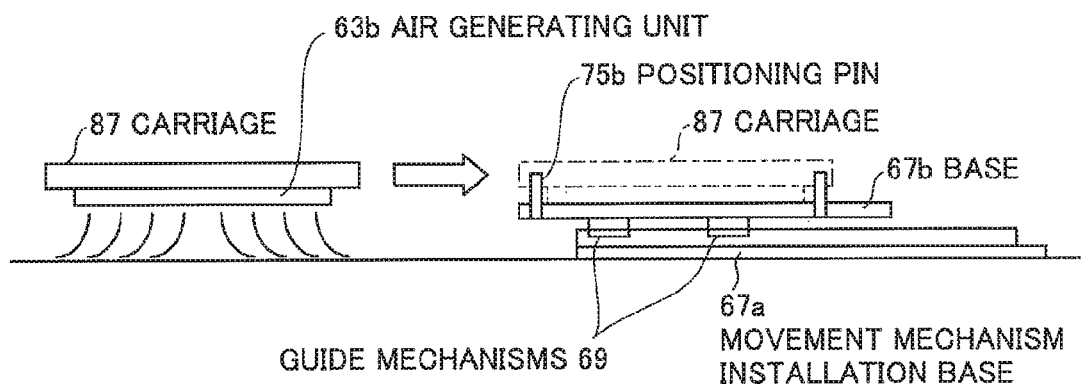
FIG. 30 is a rear view showing a twenty-eighth example related to the movement mechanism and the positioning mechanism of the EUV light source apparatus.

FIG. 30 is a rear view showing a twenty-eighth example related to the movement mechanism and the positioning mechanism of the EUV light source apparatus.

As shown in FIG. 30, the EUV light source apparatus 1 according to the twenty-eighth example includes an air generating unit 63b, which is the same as that in the eighth example, on the lower surface of the carriage 87. Further, the chamber 10 is positioned on the carriage 87, and moves to the maintenance area as the carriage 87 moves.

Positioning of the carriage 87 is the same as that in the eighth example in that two or more positioning pins 75b are used. However, in the twenty-eighth example, the positioning pins 75b are provided on a base 67b. The base 67b is further placed on a movement mechanism installation base 67a via a guide mechanism such as slide rails like those in the twenty-sixth example. The movement mechanism installation base 67a is fixed to the floor by anchor bolts. According to the configuration, the carriage 87 with the chamber 10 mounted thereon moves toward the projection optics 20 together with the base 67b by the guide mechanism 69, and is positioned in a predetermined location where the optical axes of the chamber 10 and the projection optics 20 are aligned with each other.

As the positioning mechanism for positioning the base 67b in the twenty-eighth example, the same configurations as the positioning block 71a and the fixing plate 72 in the first example may be used or the positioning mechanism 70 in the other examples may be used.

Figure 31:
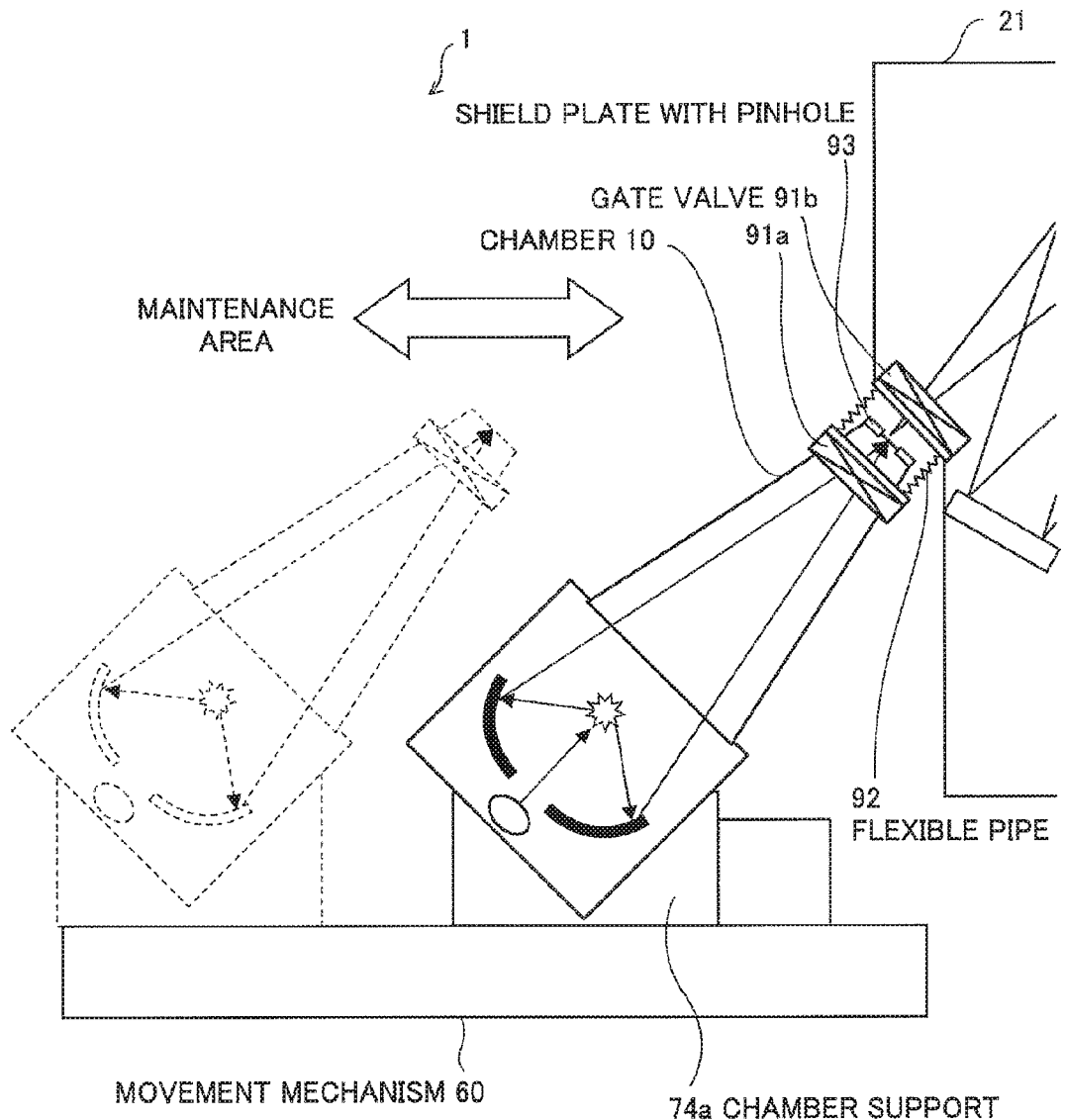
FIG. 31 is a side view showing a twenty-ninth example related to a connection part between the EUV light source apparatus and projection optics.

FIG. 31 is a side view showing a twenty-ninth example related to a connection part between the EUV light source apparatus 1 and the projection optics 20. Both of the interior of the chamber 10 of the EUV light source apparatus 1 and the interior of the projection optics 20 are in a vacuum state or filled with a low-pressure gas for transmitting EUV light (e.g., an inert gas such as Ar or He, or a hydrogen gas, halogen gas, or halogenated hydrogen gas for etching of an adhered material) for use in order to provide good environment for transmitting EUV light. Accordingly, for easy maintenance of the chamber 10, a gate valve 91a of the chamber 10 and a gate valve 91b of the projection optics 20 are provided in the connection part located in an optical path between the chamber 10 and the projection optics 20, and a flexible pipe 92 is provided between the gate valve 91a and the gate valve 91b. Further, in the flexible pipe 92, a shield plate with pinhole 93 formed with a pinhole therein is fixed to the chamber 10 side. The EUV light is entered into the projection optics 20 through the pinhole. The shield plate with pinhole 93 prevents the target material or the like within the chamber 10 or the above-mentioned low-pressure gas for transmitting EUV light from entering the projection optics 20.

As the movement mechanism and the positioning mechanism, not only the movement mechanisms and the positioning mechanisms described in the first to twenty-eighth examples but also any movement mechanism and positioning mechanism may be used.

At maintenance of the chamber 10, first, the gate valve 91a of the chamber 10 and the gate valve 91b of the projection optics 20 are respectively closed. Then, in the case where the chamber 10 is filled with a low-pressure reactive gas (e.g., a hydrogen gas, halogen gas, or halogenated hydrogen gas), the gas is evacuated by a vacuum pump, and the chamber 10 is filled with an inert gas of nitrogen gas, argon gas, or the like to the degree of atmospheric pressure. Then, the flexible pipe 92 is detached, and the chamber 10 is moved to the location as shown by the broken lines of FIG. 31 by the movement mechanism 60.

For placement of the chamber 10, through the opposite procedure to the above-mentioned procedure, first, the chamber 10 is moved toward the projection optics 20 by the movement mechanism 60, and the chamber 10 is positioned in the predetermined location where the optical axes of the chamber 10 and the projection optics 20 are aligned with each other by the positioning mechanism 70. Then, the flexible pipe 92 is connected between the gate valve 91a and the gate valve 91b, and the interior of the flexible pipe is evacuated to the vacuum state by the vacuum evacuation pump. Then, the gate valve 91a of the chamber 10 and the gate valve 91b of the projection optics 20 are respectively opened. In this manner, the maintenance of the chamber 10 can be done without contamination of air within the chamber 10 and the projection optics 20.

Figure 32A:
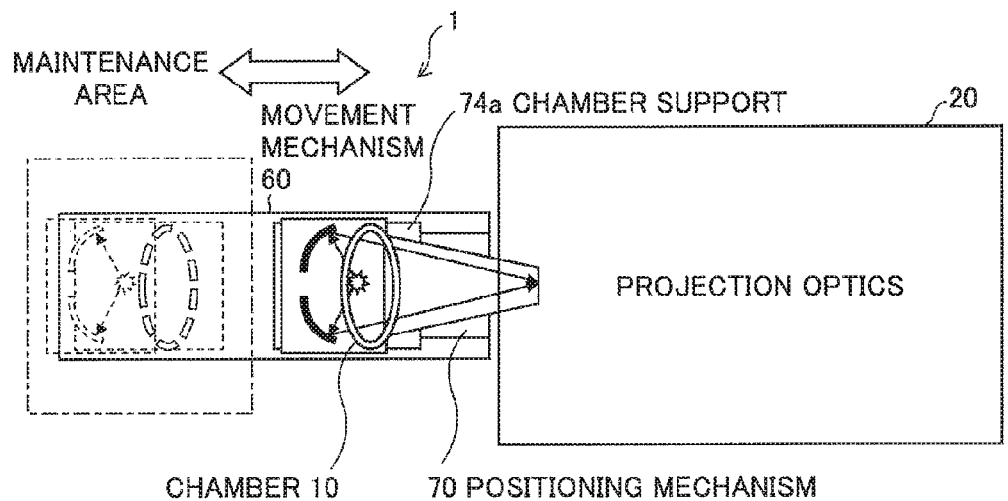
FIGS. 32A and 32B are a plan view and a side view showing a thirtieth example related to a configuration in which only a part of the chamber of the EUV light source apparatus is moved.
Figure 32B:
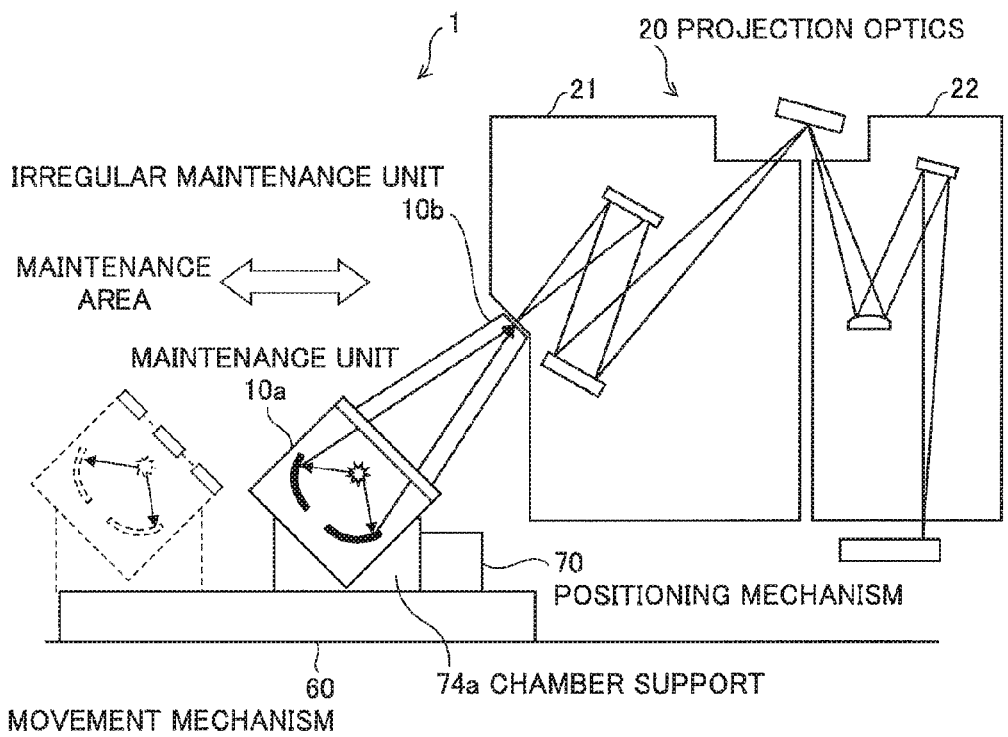

FIGS. 32A and 32B are a plan view and a side view showing a thirtieth example related to a configuration in which only a part of the chamber 10 of the EUV light source apparatus is moved, and FIGS. 33A and 33B are a plan view and a side view showing a thirty-first example related to the configuration in which only a part of the chamber 10 of the EUV light source apparatus is moved.

The chamber 10 of the EUV light source apparatus 1 according to the thirtieth example as shown in FIGS. 32A and 32B is separable into a maintenance unit 10a at the plasma generation part side and an irregular maintenance unit 10b at the projection optics 20 side. In the embodiment, the large-diameter part near the plasma generation part of the chamber 10 is the maintenance unit 10a, and the tapered part forming the optical path converging from the large-diameter part to the projection optics 20 side is the irregular maintenance unit 10b.

Also in the thirty-first example as shown in FIGS. 33A and 33B, the chamber 10 is also separable into a maintenance unit 10c at the plasma generation part side and an irregular maintenance unit 10d at the projection optics 20 side. The thirty-first embodiment is different from the thirtieth embodiment as shown in FIGS. 32A and 32B in that the tapered part of the chamber 10 is separated by a surface perpendicular to the movement direction by the movement mechanism 60, and the part at the plasma generation part side with respect to the separation surface is the maintenance unit 10c, and the part at the projection optics 20 side with respect to the separation surface is the irregular maintenance unit 10d. According to the configuration, movement operation of the maintenance unit 10c to the maintenance area side and the coupling operation to the irregular maintenance unit 10d become easier.

As specifically shown in FIGS. 33A and 33B, the maintenance unit 10a or 10c includes parts requiring regular maintenance such as the droplet generator 11, the laser beam focusing off-axis paraboloidal mirror 14, the EUV collector mirror 15, the droplet catcher 16, and a laser beam dumper 17. That is, the droplet generator 11 is the unit for supplying a target material into the chamber 10, and requires periodical replacement because clogging occurs in the target nozzle or the like after a long period of use. The laser beam focusing off-axis paraboloidal mirror 14 and the EUV collector mirror 15 require periodical replacement because its reflectance becomes lower during use by adherence of the target material, ion etching, or the like. The droplet catcher 16 is a unit for collecting the target material that has not been turned into plasma though supplied from the droplet generator 11, and requires periodical replacement because it is contaminated by the target material during use. The laser beam dumper 17 is a unit for receiving the laser beam applied for excitation of the target material, and requires periodical replacement because the target material within the chamber 10 adheres to it during use.

On the other hand, the irregular maintenance unit 10b or 10d does not require the frequent maintenance like the maintenance unit 10a or 10c. Accordingly, in these embodiments, only the maintenance unit 10a or 10c can be carried to the maintenance area.

In the joint part between the maintenance unit 10a or 10c and the irregular maintenance unit 10b or 10d, an O-ring, a metal seal, or the like is embedded. Further, the maintenance unit 10a or 10c and the irregular maintenance unit 10b or 10d are united, clamped, and sealed by bolts, clamp, or the like.

As the movement mechanism and the positioning mechanism, not only the movement mechanisms and the positioning mechanisms described in the first to twenty-eighth examples but also any movement mechanism and positioning mechanism may be used. The movement mechanisms and the positioning mechanisms in the thirtieth and thirty-first examples moves and positions only the maintenance unit 10a or 10c of the chamber 10 for maintenance.

When the maintenance unit 10a or 10c is moved to the maintenance area, first, the chamber 10 is purged by an inert gas such as nitrogen gas or argon gas, and the gas is injected into the chamber 10 up to near the atmospheric pressure. Then, the bolts, clamp, or the like for uniting the maintenance unit 10a or 10c and the irregular maintenance unit 10b or 10d is detached. Then, the maintenance unit 10a or 10c is moved by the movement mechanism 60 to the maintenance area, and the separated maintenance unit 10a or 10c and irregular maintenance unit 10b or 10d are respectively closed by plates as lids.

For placement of the maintenance unit 10a or 10c, through the opposite procedure to the above-mentioned procedure, first, the lids on the separation surface are respectively detached from the maintenance unit 10a or 10c on the movement mechanism 60 and the irregular maintenance unit 10b or 10d remaining at the projection optics 20 side. Then, the maintenance unit 10a or 10c is moved by the movement mechanism 60 to the irregular maintenance unit 10b or 10d side, and the maintenance unit 10a or 10c is positioned in the predetermined location where the optical axis of the EUV light is aligned with the optical axis of the projection optics 20 by the positioning mechanism 70. Then, the maintenance unit 10a or 10c and the irregular maintenance unit 10b or 10d are united, clamped by bolts, clamp, or the like, and sealed. Then, the interior of the chamber 10 is evacuated by the vacuum evacuation pump.

The invention claimed is:

1. An extreme ultraviolet light source apparatus configured to generate plasma by applying a laser beam to a target material and entering extreme ultraviolet light radiated from the plasma into projection optics of exposure equipment, the apparatus comprising:
 a chamber in which the extreme ultraviolet light is generated;
 a movement mechanism for moving at least a part of the chamber positioned in a predetermined location between the predetermined location and a maintenance area, the predetermined location where an optical axis of collected extreme ultraviolet light and an optical axis of the projection optics of the exposure equipment are aligned with each other; and
 a laser beam introduction duct for introducing the laser beam from an outside of the chamber to an inside of the chamber, the laser beam introduction duct being provided outside of a track on which at least the part of the chamber moves between the predetermined location and the maintenance area.

2. The extreme ultraviolet light source apparatus according to claim 1, wherein the laser beam introduction duct is detached from at least the part of the chamber at maintenance of the chamber.

3. The extreme ultraviolet light source apparatus according to claim 1, wherein the laser beam introduction duct includes a flexible pipe provided on a part of the laser beam introduction duct for introducing the laser beam into the chamber.

4. An extreme ultraviolet light source apparatus configured to generate plasma by applying a laser beam to a target material and entering extreme ultraviolet light radiated from the plasma into projection optics of exposure equipment, the apparatus comprising:
 a chamber in which the extreme ultraviolet light is generated; and
 a movement mechanism for moving at least a part of the chamber positioned in a predetermined location between the predetermined location and a maintenance area, the predetermined location where an optical axis of collected extreme ultraviolet light and an optical axis of the projection optics of the exposure equipment are aligned with each other; wherein
 the movement mechanism moves the part of the chamber in a direction crossing a direction of introducing the laser beam into the chamber.

5. The extreme ultraviolet light source apparatus according to claim 4, wherein an optical axis of the extreme ultraviolet light source apparatus is aligned with an optical axis of the exposure equipment when at least the part of the chamber is positioned in the predetermined location.

6. An extreme ultraviolet light source apparatus configured to generate plasma by applying a laser beam to a target material and entering extreme ultraviolet light radiated from the plasma into projection optics of exposure equipment, the apparatus comprising:
 a chamber in which the extreme ultraviolet light is generated;
 a movement mechanism for moving at least a part of the chamber positioned in a predetermined location between the predetermined location and a maintenance area, the predetermined location where an optical axis of collected extreme ultraviolet light and an optical axis of the projection optics of the exposure equipment are aligned with each other; and
 an evacuation unit for evacuating air from an inside of the chamber to an outside of the chamber, the evacuation unit being provided outside of a track on which at least the part of the chamber moves between the predetermined location and the maintenance area.

7. The extreme ultraviolet light source apparatus according to claim 6, wherein the evacuation unit includes a flexible pipe provided on a part of the evacuation unit for evacuating the air out of the chamber.

8. The extreme ultraviolet light source apparatus according to claim 7, wherein the chamber is provided with a gate valve connected to the flexible pipe.

* * * * *